US012563746B2

(12) United States Patent　　　　(10) Patent No.:　US 12,563,746 B2

Pellizzer et al.　　　　　　　　　　　(45) Date of Patent:　　Feb. 24, 2026

(54) TRENCH AND PIER ARCHITECTURES THAT PROVIDE MECHANICAL SUPPORT DURING FORMATION OF THREE-DIMENSIONAL MEMORY ARRAYS

(71) Applicant: Micron Technology, Inc., Boise, ID (US)

(72) Inventors: Fabio Pellizzer, Boise, ID (US); Russell L Meyer, Boise, ID (US); Stephen W. Russell, Boise, ID (US); Lorenzo Fratin, Buccinasco (IT)

(73) Assignee: Micron Technology, Inc., Boise, ID (US)

( * ) Notice: Subject to any disclaimer, the term of this patent is extended or adjusted under 35 U.S.C. 154(b) by 669 days.

(21) Appl. No.: 17/714,771

(22) Filed: Apr. 6, 2022

(65) Prior Publication Data

US 2023/0329010 A1　　Oct. 12, 2023

(51) Int. Cl.
　　*H10B 63/00*　　(2023.01)
　　*H10N 70/00*　　(2023.01)
　　*H10N 70/20*　　(2023.01)

(52) U.S. Cl.
　　CPC ......... *H10B 63/845* (2023.02); *H10N 70/063* (2023.02); *H10N 70/231* (2023.02); *H10N 70/882* (2023.02)

(58) Field of Classification Search
　　CPC ...... H10B 63/845; H10B 63/34; H10B 63/10; H10N 70/063; H10N 70/231; H10N 70/882; H10N 70/066

See application file for complete search history.

(56) References Cited

U.S. PATENT DOCUMENTS

2008/0137400 A1* 6/2008 Chen ................. H10N 70/8413
　　　　　　　　　　　　　　　　　　438/54
2019/0115071 A1* 4/2019 Nardi ..................... H10B 63/34

(Continued)

OTHER PUBLICATIONS

Tizno, Ofogh, et al. "Room-temperature operation of low-voltage, non-volatile, compound-semiconductor memory cells." Scientific reports 9.1 (2019): 8950. (Year: 2019).*

(Continued)

*Primary Examiner* — Norman D Richards
*Assistant Examiner* — Ethan Edward Cutler
(74) *Attorney, Agent, or Firm* — Holland & Hart LLP

(57)　　　　ABSTRACT

Methods, systems, and devices for trench and pier architectures for three-dimensional memory arrays are described. A semiconductor device (e.g., a memory die) may include pier structures formed in contact with features formed from alternating layers of materials deposited over a substrate, which may provide support for subsequent processing. For example, a memory die may include alternating layers of a first material and a second material, which may be formed into various cross-sectional patterns. Pier structures may be formed in contact with the cross sectional patterns such that, when either the first material or the second material is removed to form voids, the pier structures may provide mechanical support of the cross-sectional pattern of the remaining material. In some examples, such pier structures may be formed within or along trenches or other features aligned along a direction of a memory array, which may provide a degree of self-alignment for subsequent operations.

25 Claims, 15 Drawing Sheets

SECTION P1-P1'

SECTION P2-P2'

SECTION X1-X1'

SECTION X2-X2'

(56) References Cited

U.S. PATENT DOCUMENTS

2021/0005665 A1 *   1/2021   Fantini .................. H10B 63/84
2022/0051944 A1 *   2/2022   Fantini ................ H10N 70/823

OTHER PUBLICATIONS

Shim, Jaeho, et al. "Tungsten oxide nonvolatile memory devices using photothermal in-situ oxidation method." Materials Letters 272 (2020): 127805. (Year: 2020).*

* cited by examiner

SECTION A-A

☒ Unselected Memory Cell 105        ■ Selected Memory Cell 105-a

200

SECTION B-B

Unselected Memory Cell 105     Selected Memory Cell 105-a

200

SECTION C-C

Unselected Memory Cell 105     Selected Memory Cell 105-a

200

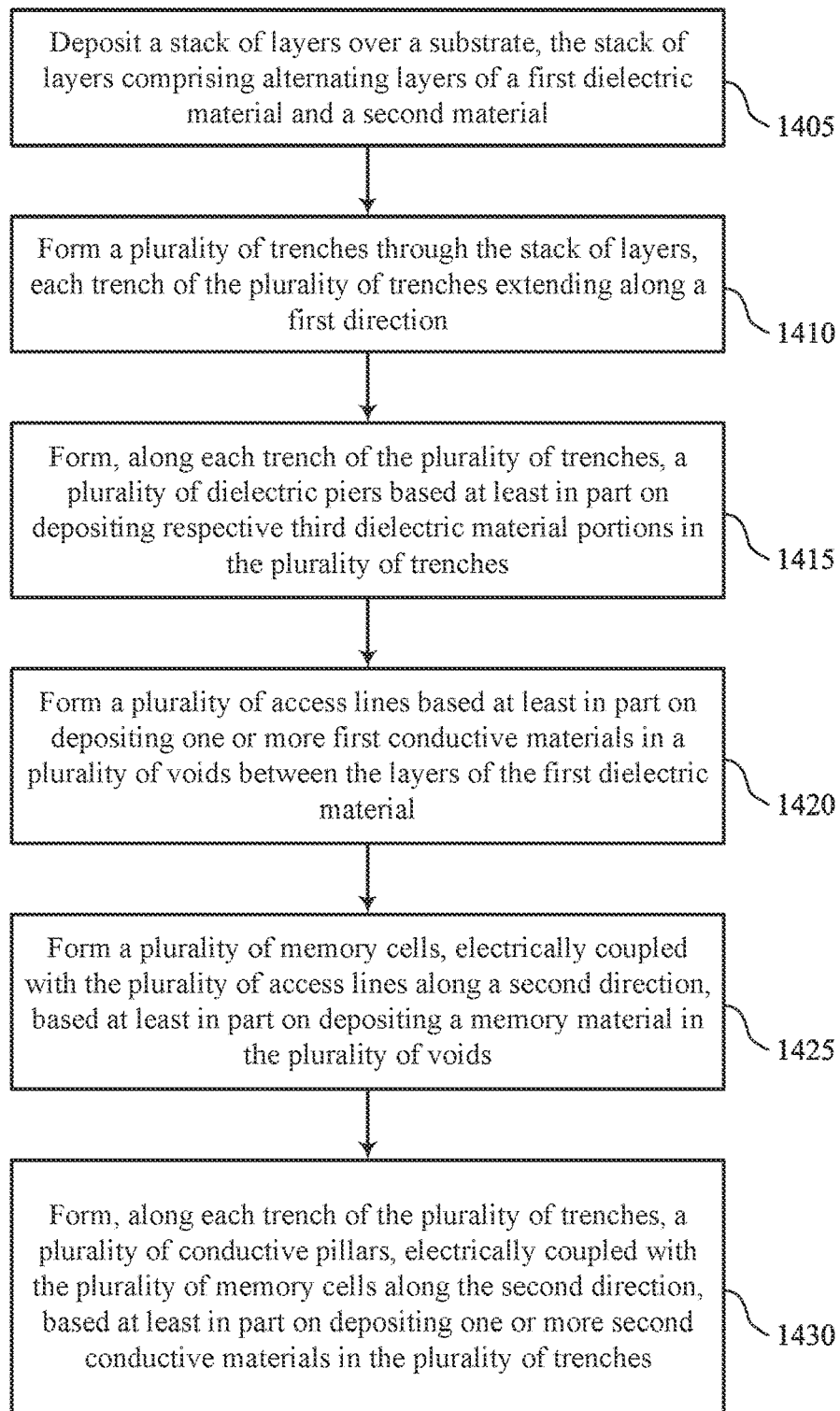

Deposit a stack of layers over a substrate, the stack of layers comprising alternating layers of a first dielectric material and a second material ⟍ 1405

Form a plurality of trenches through the stack of layers, each trench of the plurality of trenches extending along a first direction ⟍ 1410

Form, along each trench of the plurality of trenches, a plurality of dielectric piers based at least in part on depositing respective third dielectric material portions in the plurality of trenches ⟍ 1415

Form a plurality of access lines based at least in part on depositing one or more first conductive materials in a plurality of voids between the layers of the first dielectric material ⟍ 1420

Form a plurality of memory cells, electrically coupled with the plurality of access lines along a second direction, based at least in part on depositing a memory material in the plurality of voids ⟍ 1425

Form, along each trench of the plurality of trenches, a plurality of conductive pillars, electrically coupled with the plurality of memory cells along the second direction, based at least in part on depositing one or more second conductive materials in the plurality of trenches ⟍ 1430

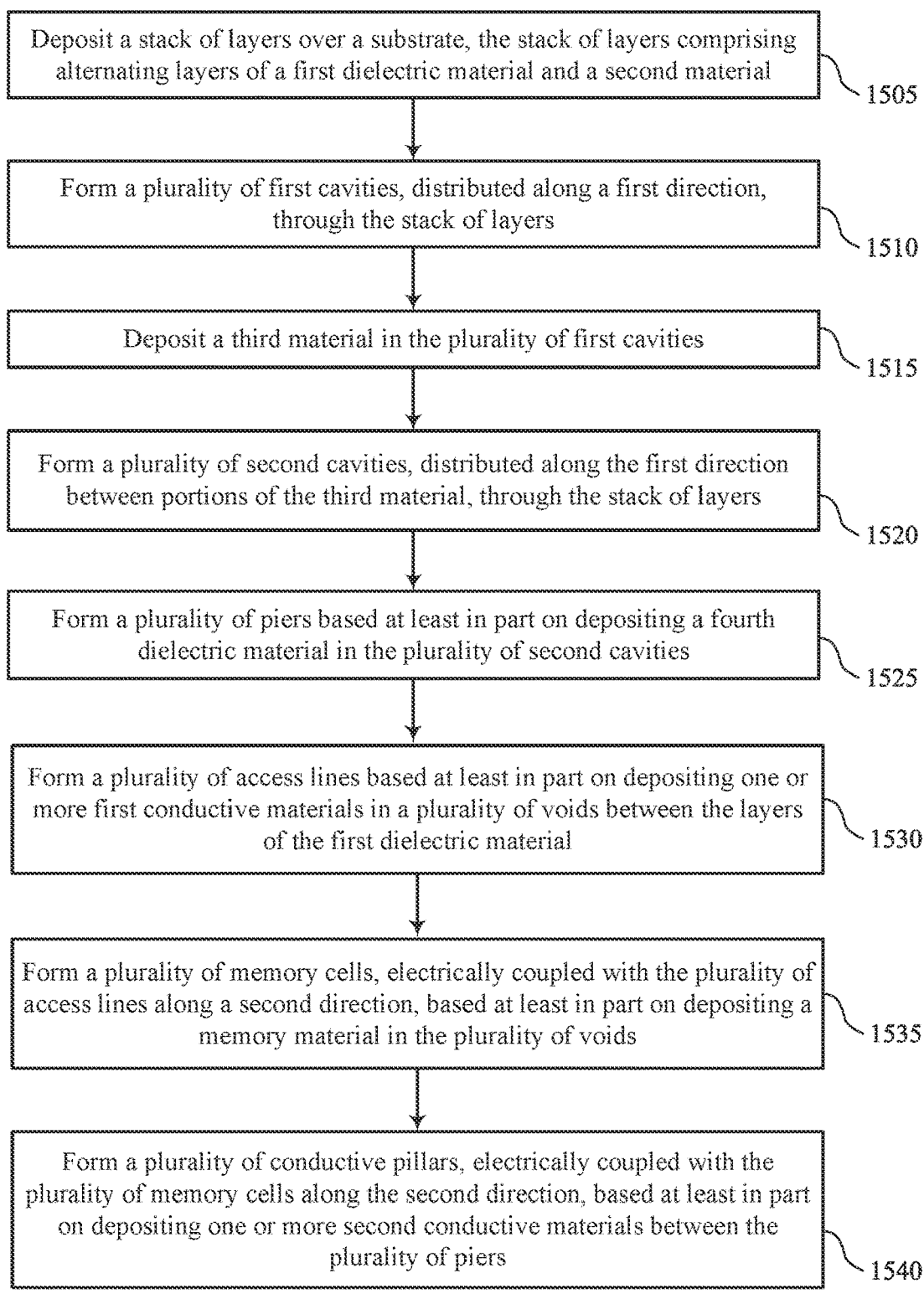

Deposit a stack of layers over a substrate, the stack of layers comprising alternating layers of a first dielectric material and a second material ~ 1505

Form a plurality of first cavities, distributed along a first direction, through the stack of layers ~ 1510

Deposit a third material in the plurality of first cavities ~ 1515

Form a plurality of second cavities, distributed along the first direction between portions of the third material, through the stack of layers ~ 1520

Form a plurality of piers based at least in part on depositing a fourth dielectric material in the plurality of second cavities ~ 1525

Form a plurality of access lines based at least in part on depositing one or more first conductive materials in a plurality of voids between the layers of the first dielectric material ~ 1530

Form a plurality of memory cells, electrically coupled with the plurality of access lines along a second direction, based at least in part on depositing a memory material in the plurality of voids ~ 1535

Form a plurality of conductive pillars, electrically coupled with the plurality of memory cells along the second direction, based at least in part on depositing one or more second conductive materials between the plurality of piers ~ 1540

TRENCH AND PIER ARCHITECTURES THAT PROVIDE MECHANICAL SUPPORT DURING FORMATION OF THREE-DIMENSIONAL MEMORY ARRAYS

FIELD OF TECHNOLOGY

The following relates to one or more systems for memory, including trench and pier architectures for three-dimensional memory arrays.

BACKGROUND

Memory devices are widely used to store information in various electronic devices such as computers, user devices, wireless communication devices, cameras, digital displays, and the like. Information is stored by programming memory cells within a memory device to various states. For example, binary memory cells may be programmed to one of two supported states, often denoted by a logic 1 or a logic 0. In some examples, a single memory cell may support more than two states, any one of which may be stored. To access the stored information, a component may read (e.g., sense, detect, retrieve, identify, determine, evaluate) a stored state in the memory device. To store information, a component may write (e.g., program, set, assign) the state in the memory device.

Various types of memory devices and memory cells exist, including magnetic hard disks, random access memory (RAM), read-only memory (ROM), dynamic RAM (DRAM), synchronous dynamic RAM (SDRAM), static RAM (SRAM), ferroelectric RAM (FeRAM), magnetic RAM (MRAM), resistive RAM (RRAM), flash memory, phase change memory (PCM), self-selecting memory, chalcogenide memory technologies, and others. Memory cells may be described in terms of volatile configurations or non-volatile configurations. Memory cells configured in a non-volatile configuration may maintain stored logic states for extended periods of time even in the absence of an external power source. Memory cells configured in a volatile configuration may lose stored states when disconnected from an external power source.

BRIEF DESCRIPTION OF THE DRAWINGS

FIGS. 14 and 15 show flowcharts illustrating a method or methods that support trench and pier architectures for three-dimensional memory arrays in accordance with examples as disclosed herein.

DETAILED DESCRIPTION

Figure 1:
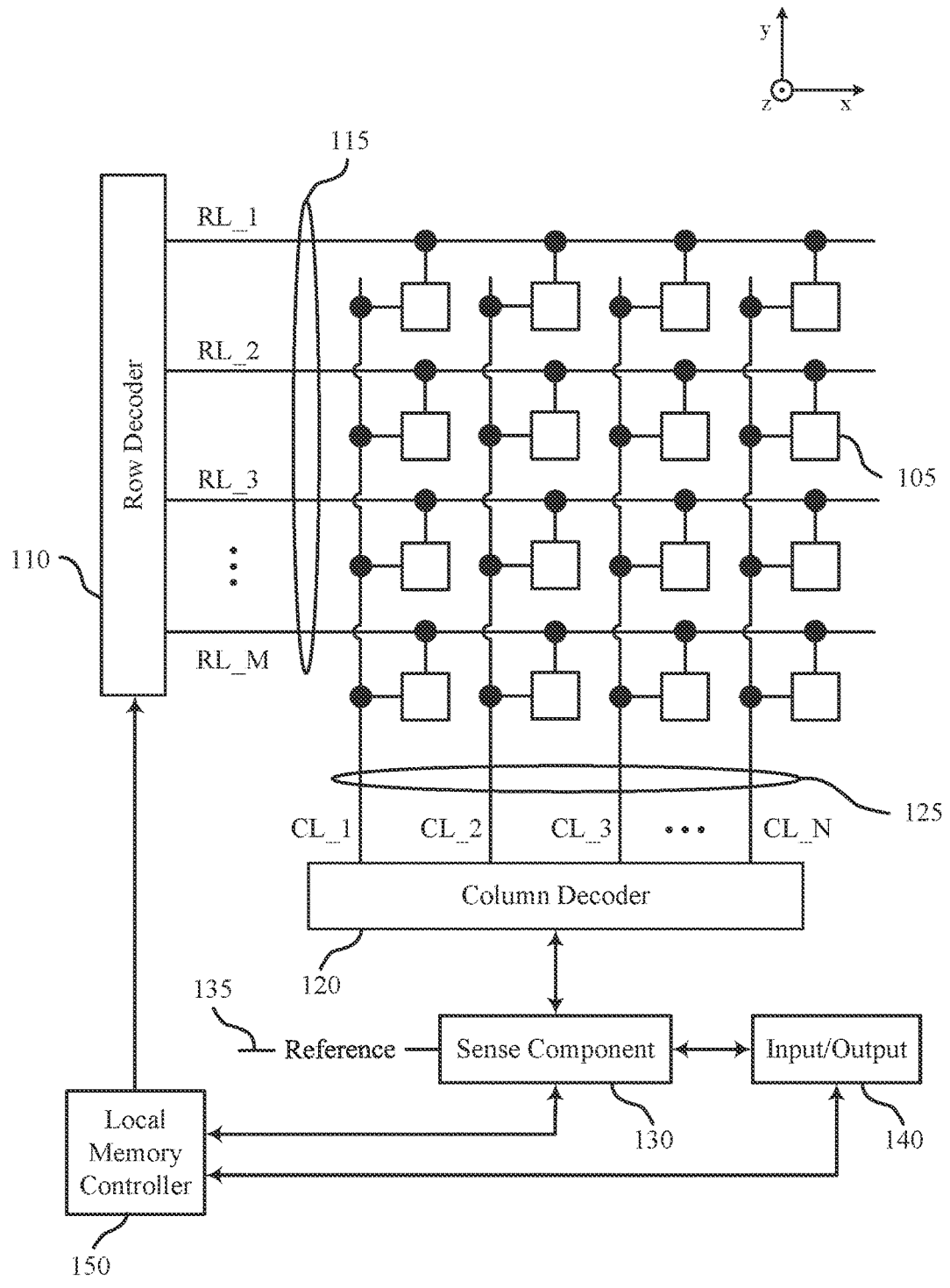
FIG. 1 illustrates an example of a memory array that supports trench and pier architectures for three-dimensional memory arrays in accordance with examples as disclosed herein.

In some semiconductor manufacturing operations, voids may be formed between layers of material deposited over a substrate, and other materials may be deposited in the voids (e.g., between the layers of material) to form various circuit structures. For example, in some memory applications, voids may be formed between layers of a dielectric material, and features of a memory array, such as access lines or memory cells (e.g., of different levels of the memory array), may be formed from materials deposited between the layers of the dielectric material. However, in some examples, features formed from the layers of dielectric material may lack sufficient mechanical support for subsequent processing, and this lacking sufficient mechanical support may be associated with mechanical instability (e.g., buckling, deformation) of the features formed from the layers of dielectric material during processing. In some examples, such mechanical instability may lead to poor tolerances or failure to implement circuit structures of a semiconductor device, among other issues.

In accordance with examples as disclosed herein, a semiconductor device (e.g., a memory die) may include pier structures formed in contact with features formed from alternating layers of materials deposited over a substrate, which will provide improved mechanical support for subsequent processing. For example, a memory die may include alternating layers of a first material and a second material, which may be formed into various cross-sectional patterns. In some examples, the alternating layers may be formed into a pair of interleaved comb structures. Pier structures may be formed in contact with the cross sectional patterns such that, when either the first material or the second material is removed (e.g., in a selective etching operation) to form voids (e.g., along a direction relative to the substrate), the pier structures provide mechanical support of the cross-sectional pattern of the remaining material. In some examples, such pier structures may be formed within or along trenches formed along a direction of a memory array, which may provide a degree of self-alignment for subsequent operations (e.g., to reduce a reliance on precise alignment between different patterning operations). By implementing such pier structures, the cross-sectional patterns themselves or voids within the cross-sectional patterns will be formed with improved stability or tolerances, such that subsequent formation of features (e.g., circuit structures, access lines, memory cells) will be performed with reduced variability or otherwise improved consistency, among other advantages.

Features of the disclosure are initially described in the context of memory devices and arrays with reference to FIGS. 1, 2, 3A, and 3B. Features of the disclosure are described in the context of material arrangements and related manufacturing operations with reference to FIGS. 4 through 13. These and other features of the disclosure are further illustrated by and described with reference to flowcharts that relate to trench and pier architectures for three-dimensional memory arrays as described with reference to FIGS. 14 and 15.

FIG. 1 illustrates an example of a memory device 100 that supports trench and pier architectures for three-dimensional memory arrays in accordance with examples as disclosed herein. In some examples, the memory device 100 may be referred to as or include a memory die, a memory chip, or an electronic memory apparatus. The memory device 100 may be operable to provide locations to store information (e.g., physical memory addresses) that may be used by a system (e.g., a host device coupled with the memory device 100, for writing information, for reading information).

The memory device 100 may include one or more memory cells 105 that each may be programmable to store different logic states (e.g., a programmed one of a set of two or more possible states). For example, a memory cell 105 may be operable to store one bit of information at a time (e.g., a logic 0 or a logic 1). In some examples, a memory cell 105 (e.g., a multi-level memory cell 105) may be operable to store more than one bit of information at a time (e.g., a logic 00, logic 01, logic 10, a logic 11). In some examples, the memory cells 105 may be arranged in an array.

A memory cell 105 may store a logic state using a configurable material, which may be referred to as a memory element, a storage element, a memory storage element, a material element, a material memory element, a material portion, or a polarity-written material portion, among others. A configurable material of a memory cell 105 may refer to a chalcogenide-based storage component. For example, a chalcogenide storage element may be used in a phase change memory cell, a thresholding memory cell, or a self-selecting memory cell, among other architectures.

In some examples, the material of a memory cell 105 may include a chalcogenide material or other alloy including selenium (Se), tellurium (Te), arsenic (As), antimony (Sb), carbon (C), germanium (Ge), silicon (Si), or indium (In), or various combinations thereof. In some examples, a chalcogenide material having primarily selenium (Se), arsenic (As), and germanium (Ge) may be referred to as a SAG-alloy. In some examples, a SAG-alloy may also include silicon (Si) and such chalcogenide material may be referred to as SiSAG-alloy. In some examples, SAG-alloy may include silicon (Si) or indium (In) or a combination thereof and such chalcogenide materials may be referred to as SiSAG-alloy or InSAG-alloy, respectively, or a combination thereof. In some examples, the chalcogenide material may include additional elements such as hydrogen (H), oxygen (O), nitrogen (N), chlorine (Cl), or fluorine (F), each in atomic or molecular forms.

In some examples, a memory cell 105 may be an example of a phase change memory cell. In such examples, the material used in the memory cell 105 may be based on an alloy (such as the alloys listed above) and may be operated so as to change to different physical state (e.g., undergo a phase change) during normal operation of the memory cell 105. For example, a phase change memory cell 105 may be associated with a relatively disordered atomic configuration (e.g., a relatively amorphous state) and a relatively ordered atomic configuration (e.g., a relatively crystalline state). A relatively disordered atomic configuration may correspond to a first logic state (e.g., a RESET state, a logic 0) and a relatively ordered atomic configuration may correspond to a second logic state (e.g., a logic state different than the first logic state, a SET state, a logic 1).

In some examples (e.g., for thresholding memory cells 105, for self-selecting memory cells 105), some or all of the set of logic states supported by the memory cells 105 may be associated with a relatively disordered atomic configuration of a chalcogenide material (e.g., the material in an amorphous state may be operable to store different logic states). In some examples, the storage element of a memory cell 105 may be an example of a self-selecting storage element. In such examples, the material used in the memory cell 105 may be based on an alloy (e.g., such as the alloys listed above) and may be operated so as to undergo a change to a different physical state during normal operation of the memory cell 105. For example, a self-selecting or thresholding memory cell 105 may have a high threshold voltage state and a low threshold voltage state. A high threshold voltage state may correspond to a first logic state (e.g., a RESET state, a logic 0) and a low threshold voltage state may correspond to a second logic state (e.g., a logic state different than the first logic state, a SET state, a logic 1).

During a write operation (e.g., a programming operation) of a self-selecting or thresholding memory cell 105, a polarity used for a write operation may influence (e.g., determine, set, program) a behavior or characteristic of the material of the memory cell 105, such as a thresholding characteristic (e.g., a threshold voltage) of the material. A difference between thresholding characteristics of the material of the memory cell 105 for different logic states stored by the material of the memory cell 105 (e.g., a difference between threshold voltages when the material is storing a logic state '0' versus a logic state '1') may correspond to the read window of the memory cell 105.

The memory device 100 may include access lines (e.g., row lines 115 each extending along an illustrative x-direction, column lines 125 each extending along an illustrative y-direction) arranged in a pattern, such as a grid-like pattern. Access lines may be formed with one or more conductive materials. In some examples, row lines 115, or some portion thereof, may be referred to as word lines. In some examples, column lines 125, or some portion thereof, may be referred to as digit lines or bit lines. References to access lines, or their analogues, are interchangeable without loss of understanding. Memory cells 105 may be positioned at intersections of access lines, such as row lines 115 and the column lines 125. In some examples, memory cells 105 may also be arranged (e.g., addressed) along an illustrative z-direction, such as in an implementation of sets of memory cells 105 being located at different levels (e.g., layers, decks, planes, tiers) along the illustrative z-direction. In some examples, a memory device 100 that includes memory cells 105 at different levels may be supported by a different configuration of access lines, decoders, and other supporting circuitry than shown.

Operations such as read operations and write operations may be performed on the memory cells 105 by activating access lines such as one or more of a row line 115 or a column line 125, among other access lines associated with alternative configurations. For example, by activating a row line 115 and a column line 125 (e.g., applying a voltage to the row line 115 or the column line 125), a memory cell 105 may be accessed in accordance with their intersection. An intersection of a row line 115 and a column line 125, among other access lines, in various two-dimensional or three-dimensional configuration may be referred to as an address of a memory cell 105. In some examples, an access line may be a conductive line coupled with a memory cell 105 and may be used to perform access operations on the memory cell 105. In some examples, the memory device 100 may perform operations responsive to commands, which may be issued by a host device coupled with the memory device 100 or may be generated by the memory device 100 (e.g., by a local memory controller 150).

Accessing the memory cells 105 may be controlled through one or more decoders, such as a row decoder 110 or a column decoder 120, among other examples. For example, a row decoder 110 may receive a row address from the local memory controller 150 and activate a row line 115 based on the received row address. A column decoder 120 may receive a column address from the local memory controller 150 and may activate a column line 125 based on the received column address.

The sense component 130 may be operable to detect a state (e.g., a material state, a resistance state, a threshold state) of a memory cell 105 and determine a logic state of the memory cell 105 based on the detected state. The sense component 130 may include one or more sense amplifiers to convert (e.g., amplify) a signal resulting from accessing the memory cell 105 (e.g., a signal of a column line 125 or other access line). The sense component 130 may compare a signal detected from the memory cell 105 to a reference 135 (e.g., a reference voltage, a reference charge, a reference current). The detected logic state of the memory cell 105 may be provided as an output of the sense component 130 (e.g., to an input/output component 140), and may indicate the detected logic state to another component of the memory device 100 or to a host device coupled with the memory device 100.

The local memory controller 150 may control the accessing of memory cells 105 through the various components (e.g., a row decoder 110, a column decoder 120, a sense component 130, among other components). In some examples, one or more of a row decoder 110, a column decoder 120, and a sense component 130 may be co-located with the local memory controller 150. The local memory controller 150 may be operable to receive information (e.g., commands, data) from one or more different controllers (e.g., an external memory controller associated with a host device, another controller associated with the memory device 100), translate the information into a signaling that can be used by the memory device 100, perform one or more operations on the memory cells 105 and communicate data from the memory device 100 to a host device based on performing the one or more operations. The local memory controller 150 may generate row address signals and column address signals to activate access lines such as a target row line 115 and a target column line 125. The local memory controller 150 also may generate and control various signals (e.g., voltages, currents) used during the operation of the memory device 100. In general, the amplitude, the shape, or the duration of an applied signal discussed herein may be varied and may be different for the various operations discussed in operating the memory device 100.

The local memory controller 150 may be operable to perform one or more access operations on one or more memory cells 105 of the memory device 100. Examples of access operations may include a write operation, a read operation, a refresh operation, a precharge operation, or an activate operation, among others. In some examples, access operations may be performed by or otherwise coordinated by the local memory controller 150 in response to access commands (e.g., from a host device). The local memory controller 150 may be operable to perform other access operations not listed here or other operations related to the operating of the memory device 100 that are not directly related to accessing the memory cells 105.

In some techniques for manufacturing a memory device 100 (e.g., for manufacturing a semiconductor die that includes one or more aspects of the memory device 100), voids may be formed between layers of material deposited over a substrate, and other materials may be deposited in the voids (e.g., between the layers of material) to form various circuit structures. For example, voids may be formed between layers of a dielectric material, and features of a memory array, such as access lines or memory cells 105 (e.g., of different levels of the memory array), may be formed from materials deposited between the layers of the dielectric material. However, in some examples, features formed from the layers of dielectric material may lack sufficient mechanical support for subsequent processing, which may be associated with mechanical instability (e.g., buckling, deformation) of the features formed from the layers of dielectric material during processing. In some examples, such mechanical instability may lead to poor tolerances or failure to implement circuit structures of the memory device 100, among other issues.

In accordance with examples as disclosed herein, a memory die that includes one or more aspects of the memory device 100 may include pier structures formed in contact with features formed from alternating layers of materials deposited over a substrate, which may provide mechanical support for subsequent processing. For example, a memory die may include alternating layers of a first material and a second material, which may be formed into various cross-sectional patterns. Pier structures may be formed in contact with the cross sectional patterns such that, when either the first material or the second material is removed (e.g., in a selective etching operation) to form voids (e.g., along a direction relative to the substrate), the pier structures provide mechanical support of the cross-sectional pattern of the remaining material. By implementing such pier structures, the cross-sectional patterns themselves or voids formed within the cross sectional patterns may be formed with improved stability or tolerances, such that subsequent formation of features (e.g., circuit structures, access lines, memory cells 105) may be performed with reduced variability or otherwise improved consistency.

Figure 2:
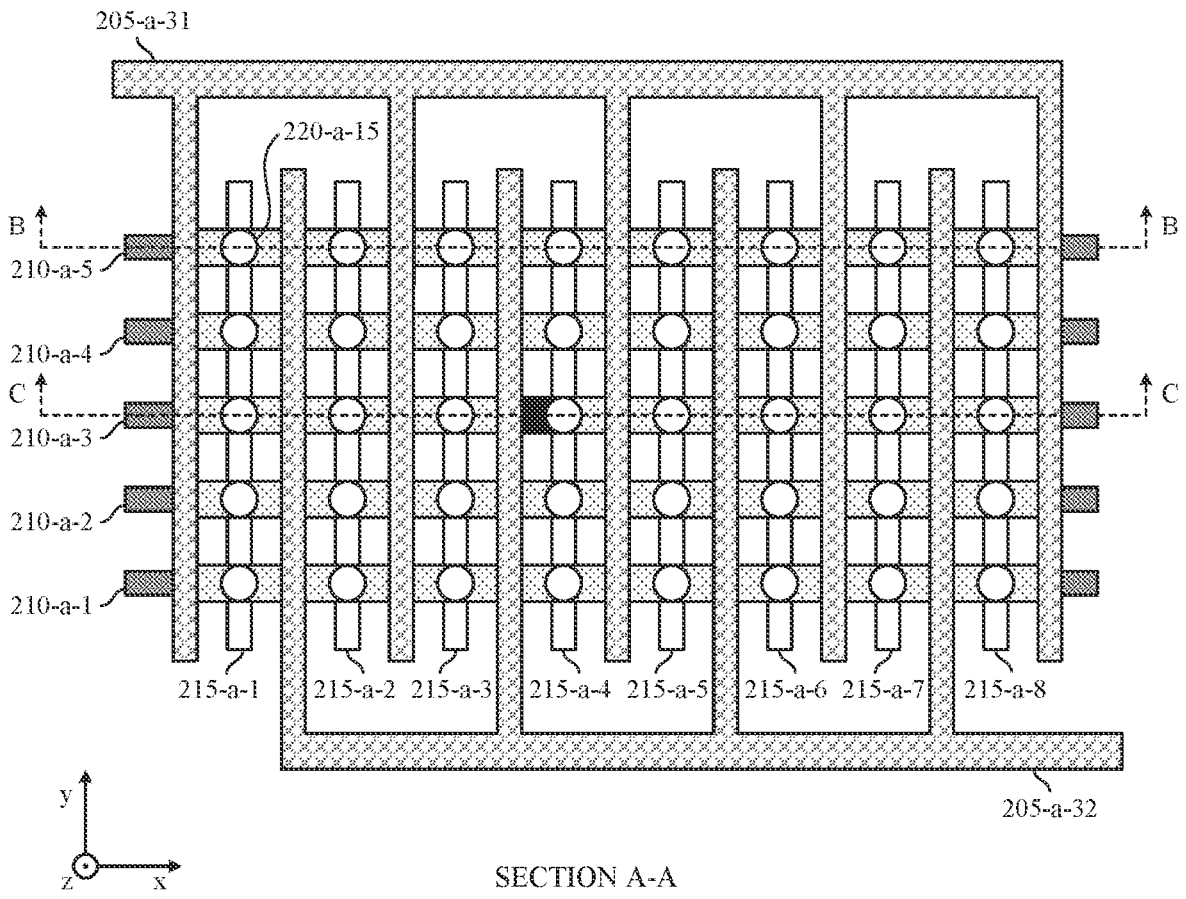
FIG. 2 illustrates a top view of an example of a memory array that supports trench and pier architectures for three-dimensional memory arrays in accordance with examples as disclosed herein.
Figure 3A:
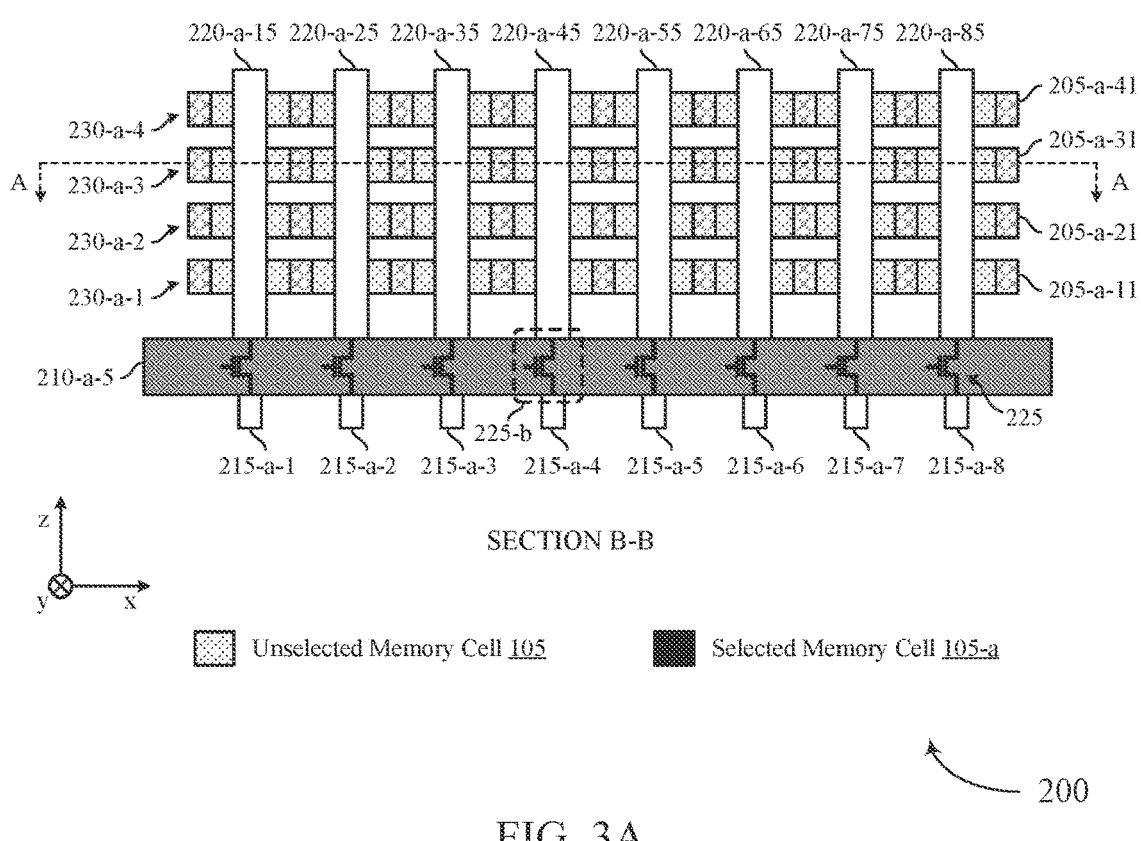
FIGS. 3A and 3B illustrate side views of an example of a memory array that supports trench and pier architectures for three-dimensional memory arrays in accordance with examples as disclosed herein.
Figure 3B:
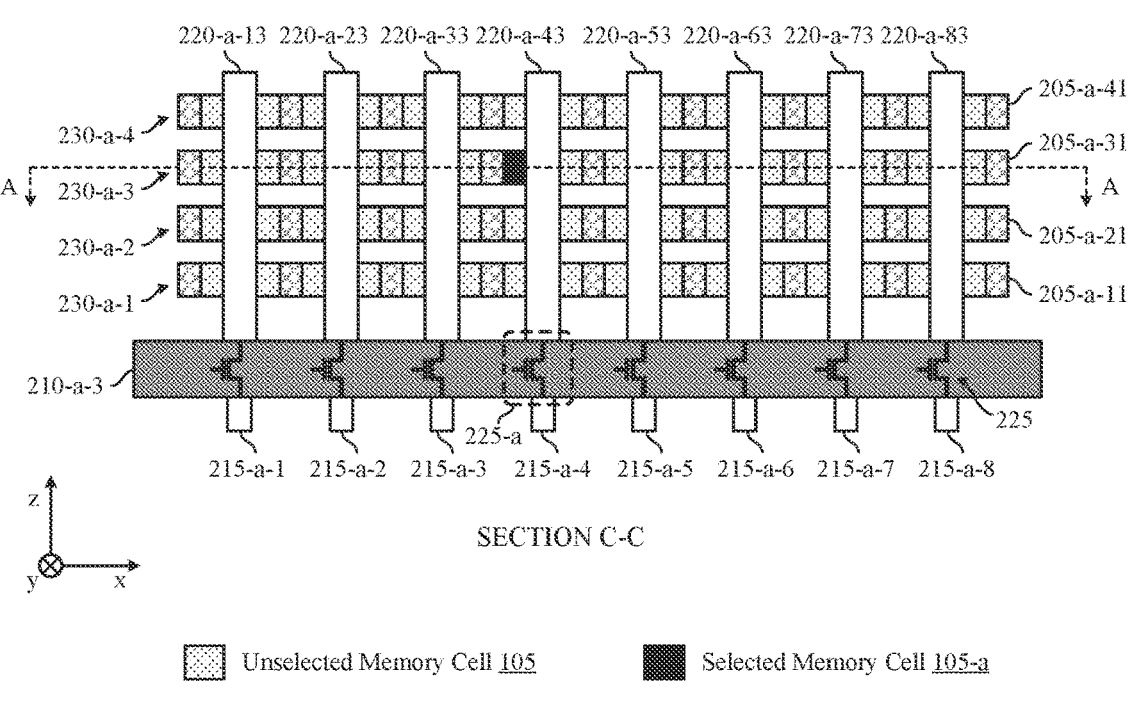

FIGS. 2, 3A, and 3B illustrate an example of a memory array 200 that supports trench and pier architectures for three-dimensional memory arrays in accordance with examples as disclosed herein. The memory array 200 may be included in a memory device 100, and illustrates an example of a three-dimensional arrangement of memory cells 105 that may be accessed by various conductive structures (e.g., access lines). FIG. 2 illustrates a top section view (e.g., SECTION A-A) of the memory array 200 relative to a cut plane A-A as shown in FIGS. 3A and 3B. FIG. 3A illustrates a side section view (e.g., SECTION B-B) of the memory array 200 relative to a cut plane B-B as shown in FIG. 2. FIG. 3B illustrates a side section view (e.g., SECTION C-C) of the memory array 200 relative to a cut plane C-C as shown in FIG. 2. The section views may be examples of cross-sectional views of the memory array 200 with some aspects (e.g., dielectric structures) removed for clarity. Elements of the memory array 200 may be described relative to an x-direction, a y-direction, and a z-direction, as illustrated in each of FIGS. 2, 3A, and 3B. Although some elements included in FIGS. 2, 3A, and 3B are labeled with a numeric indicator, other corresponding elements are not labeled, although they are the same or would be understood to be similar, in an effort to increase visibility and clarity of the depicted features. Further, although some quantities of repeated elements are shown in the illustrative example of memory array 200, techniques in accordance with examples as described herein may be applicable to any quantity of such elements, or ratios of quantities between one repeated element and another.

In the example of memory array 200, memory cells 105 and word lines 205 may be distributed along the z-direction according to levels 230 (e.g., decks, layers, planes, tiers, as illustrated in FIGS. 3A and 3B). In some examples, the z-direction may be orthogonal to a substrate (not shown) of the memory array 200, which may be below the illustrated structures along the z-direction. Although the illustrative example of memory array 200 includes four levels 230, a memory array 200 in accordance with examples as disclosed herein may include any quantity of one or more levels 230 (e.g., 64 levels, 128 levels) along the z-direction.

Each word line 205 may be an example of a portion of an access line that is formed by one or more conductive materials (e.g., one or more metal portions, one or more metal alloy portions). As illustrated, a word line 205 may be formed in a comb structure, including portions (e.g., projections, tines) extending along the y-direction through gaps (e.g., alternating gaps) between pillars 220. For example, as illustrated, the memory array 200, may include two word lines 205 per level 230 (e.g., according to odd word lines 205-a-n1 and even word lines 205-a-n2 for a given level, in), where such word lines 205 of the same level 230 may be described as being interleaved (e.g., with portions of an odd word line 205-a-n1 projecting along the y-direction between portions of an even word line 205-a-n2, and vice versa). In some examples, an odd word line 205 (e.g., of a level 230) may be associated with a first memory cell 105 on a first side (e.g., along the x-direction) of a given pillar 220 and an even word line (e.g., of the same level 230) may be associated with a second memory cell 105 on a second side (e.g., along the x-direction, opposite the first memory cell 105) of the given pillar 220. Thus, in some examples, memory cells 105 of a given level 230 may be addressed (e.g., selected, activated) in accordance with an even word line 205 or an odd word line 205.

Each pillar 220 may be an example of a portion of an access line (e.g., a conductive pillar portion) that is formed by one or more conductive materials (e.g., one or more metal portions, one or more metal alloy portions). As illustrated, the pillars 220 may be arranged in a two-dimensional array (e.g., in an xy-plane) having a first quantity of pillars 220 along a first direction (e.g., eight pillars along the x-direction, eight rows of pillars), and having a second quantity of pillars 220 along a second direction (e.g., five pillars along the y-direction, five columns of pillars). Although the illustrative example of memory array 200 includes a two-dimensional arrangement of eight pillars 220 along the x-direction and five pillars 220 along the y-direction, a memory array 200 in accordance with examples as disclosed herein may include any quantity of pillars 220 along the x-direction and any quantity of pillars 220 along the y-direction. Further, as illustrated, each pillar 220 may be coupled with a respective set of memory cells 105 (e.g., along the z-direction, one or more memory cells 105 for each level 230). A pillar 220 may have a cross-sectional area in an xy-plane that extends along the z-direction. Although illustrated with a circular cross-sectional area in the xy-plane, a pillar 220 may be formed with a different shape, such as having an elliptical, square, rectangular, polygonal, or other cross-sectional area in an xy-plane.

The memory cells 105 each may include a chalcogenide material. In some examples, the memory cells 105 may be examples of thresholding memory cells. Each memory cell 105 may be accessed (e.g., addressed, selected) according to an intersection between a word line 205 (e.g., a level selection, which may include an even or odd selection within a level 230) and a pillar 220. For example, as illustrated, a selected memory cell 105-a of the level 230-a-3 may be accessed according to an intersection between the pillar 220-a-43 and the word line 205-a-32.

A memory cell 105 may be accessed (e.g., written to, read from) by applying an access bias (e.g., an access voltage, $V_{access}$, which may be a positive voltage or a negative voltage) across the memory cell 105. In some examples, an access bias may be applied by biasing a selected word line 205 with a first voltage (e.g., $V_{access}/2$) and by biasing a selected pillar 220 with a second voltage (e.g., $-V_{access}/2$), which may have an opposite sign relative to the first voltage. Regarding the selected memory cell 105-a, a corresponding access bias (e.g., the first voltage) may be applied to the word line 205-a-32, while other unselected word lines 205 may be grounded (e.g., biased to 0V). In some examples, a word line bias may be provided by a word line driver (not shown) coupled with one or more of the word lines 205.

To apply a corresponding access bias (e.g., the second voltage) to a pillar 220, the pillars 220 may be configured to be selectively coupled with a sense line 215 (e.g., a digit line, a column line, an access line extending along the y-direction) via a respective transistor 225 coupled between (e.g., physically, electrically) the pillar 220 and the sense line 215. In some examples, the transistors 225 may be vertical transistors (e.g., transistors having a channel along the z-direction, transistors having a semiconductor junction along the z-direction), which may be formed above the substrate of the memory array 200 using various techniques (e.g., thin film techniques). In some examples, a selected pillar 220, a selected sense line 215, or a combination thereof may be an example of a selected column line 125 described with reference to FIG. 1 (e.g., a bit line).

The transistors 225 (e.g., a channel portion of the transistors 225) may be activated by gate lines 210 (e.g., activation lines, selection lines, a row line, an access line extending along the x-direction) coupled with respective gates of a set of the transistors 225 (e.g., a set along the x-direction). In other words, each of the pillars 220 may have a first end (e.g., towards the negative z-direction, a bottom end) configured for coupling with an access line (e.g., a sense line 215). In some examples, the gate lines 210, the transistors 225, or both may be considered to be components of a row decoder 110 (e.g., as pillar decoder components). In some examples, the selection of (e.g., biasing of) pillars 220, or sense lines 215, or various combinations thereof, may be supported by a column decoder 120, or a sense component 130, or both.

To apply the corresponding access bias (e.g., $-V_{access}/2$) to the pillar 220-a-43, the sense line 215-a-4 may be biased with the access bias, and the gate line 210-a-3 may be grounded (e.g., biased to 0V) or otherwise biased with an activation voltage. In an example where the transistors 225 are n-type transistors, the gate line 210-a-3 being biased with a voltage that is relatively higher than the sense line 215-a-4 may activate the transistor 225-a (e.g., cause the transistor 225-a to operate in a conducting state), thereby coupling the pillar 220-a-43 with the sense line 215-a-4 and biasing the pillar 220-a-43 with the associated access bias. However, the transistors 225 may include different channel types, or may be operated in accordance with different biasing schemes, to support various access operations.

In some examples, unselected pillars 220 of the memory array 200 may be electrically floating when the transistor 225-a is activated, or may be coupled with another voltage source (e.g., grounded, via a high-resistance path, via a leakage path) to avoid a voltage drift of the pillars 220. For example, a ground voltage being applied to the gate line 210-a-3 may not activate other transistors coupled with the gate line 210-a-3, because the ground voltage of the gate line 210-a-3 may not be greater than the voltage of the other sense lines 215 (e.g., which may be biased with a ground voltage or may be floating). Further, other unselected gate lines 210, including gate line 210-a-5 as shown in FIG. 3A, may be biased with a voltage equal to or similar to an access bias (e.g., $-V_{access}/2$, or some other negative bias or bias relatively near the access bias voltage), such that transistors 225 along an unselected gate line 210 are not activated. Thus, the transistor 225-b coupled with the gate line 210-a-5 may be deactivated (e.g., operating in a non-conductive state), thereby isolating the voltage of the sense line 215-*a*-4 from the pillar 220-*a*-45, among other pillars 220.

In a write operation, a memory cell 105 may be written to by applying a write bias (e.g., where $V_{access}=V_{write}$, which may be a positive voltage or a negative voltage) across the memory cell 105. In some examples, a polarity of a write bias may influence (e.g., determine, set, program) a behavior or characteristic of the material of the memory cell 105, such as the threshold voltage of the material. For example, applying a write bias with a first polarity may set the material of the memory cell 105 with a first threshold voltage, which may be associated with storing a logic 0. Further, applying a write bias with a second polarity (e.g., opposite the first polarity) may set the material of the memory cell with a second threshold voltage, which may be associated with storing a logic 1. A difference between threshold voltages of the material of the memory cell 105 for different logic states stored by the material of the memory cell 105 (e.g., a difference between threshold voltages when the material is storing a logic state '0' versus a logic state '1') may correspond to the read window of the memory cell 105.

In a read operation, a memory cell 105 may be read from by applying a read bias (e.g., where $V_{access}=V_{read}$, which may be a positive voltage or a negative voltage) across the memory cell 105. In some examples, a logic state of the memory cell 105 may be evaluated based on whether the memory cell 105 thresholds in the presence of the applied read bias. For example, such a read bias may cause a memory cell 105 storing a first logic state (e.g., a logic 0) to threshold (e.g., permit a current flow, permit a current above a threshold current), and may not cause a memory cell 105 storing a second logic state (e.g., a logic 1) to threshold (e.g., may not permit a current flow, may permit a current below a threshold current).

In some techniques for manufacturing the memory array 200, voids may be formed between layers of material deposited over a substrate, and other materials may be deposited in the voids (e.g., between the layers of material) to form various circuit structures. For example, voids may be formed between layers of a dielectric material, and word lines 205, memory cells 105, or both may be formed for one or more levels 230 from materials deposited between the layers of the dielectric material. In accordance with examples as disclosed herein, a memory array 200 may include pier structures formed in contact with features formed from alternating layers of materials deposited over a substrate, which may provide mechanical support for subsequent processing. For example, formation of the memory array 200 may include depositing alternating layers of a first material and a second material, which may be formed into interleaved comb structures. Pier structures may be formed in contact with the interleaved comb structures such that, when either the first material or the second material is removed to form voids (e.g., along the z-direction between layers of the comb structures), the pier structures provide mechanical support of the cross-sectional pattern of the remaining material. By implementing such pier structures, the interleaved comb structures, or voids within the interleaved comb structures, may be formed with improved stability or tolerances, such that formation of features between comb structures (e.g., pillars 220), or features between layers of the comb structures (e.g., word lines 205, memory cells 105), or both may be performed with reduced variability or otherwise improved consistency.

FIGS. 4 through 13 illustrate examples of fabrication operations that may support trench and pier architectures for three-dimensional memory arrays in accordance with examples as disclosed herein. For example, FIGS. 4 through 13 may illustrate operations for fabricating aspects of a material arrangement 400, which may be a portion of a memory device (e.g., a portion of a memory device 100, a portion of a memory array 200, a portion of a memory die). Each of FIGS. 4 through 13 may illustrate aspects of the material arrangement 400 after different subsets of or alternatives of the fabrication operations for forming the material arrangement 400 (e.g., illustrated as a material arrangement 400-*a* after a first set of one or more manufacturing operations, as a material arrangement 400-*b* after a second set of one or more manufacturing operations, and so on). Each view of FIGS. 4 through 13 may be described with reference to an x-direction, a y-direction, and a z-direction, as illustrated, which may correspond to the respective directions described with reference to the memory array 200.

Each of FIGS. 4 through 13 include section views that illustrate example cross-sections of the material arrangement 400. For example, in FIGS. 4 through 13, a view "SECTION P1-P1'" may be associated with a cross-section in an xy-plane (e.g., in accordance with a cut plane P1-P1') through a portion of the material arrangement 400 that is associated with word lines 205 and memory cells 105 (e.g., an active level, a level 230), a view "SECTION P2-P2'" may be associated with a cross-section in an xy-plane (e.g., in accordance with a cut plane P2-P2') through a portion of the material arrangement 400 that is between levels 230 (e.g., a separation level, a dielectric level), a view "SECTION X1-X1'" may be associated with a cross-section in an xz-plane (e.g., in accordance with a cut plane X1-X1') through a portion of the material arrangement 400 that is associated with conductive pillars (e.g., pillars 220), and a view "SECTION X2-X2'" may be associated with a cross-section in an xz-plane (e.g., in accordance with a cut plane X2-X2') through a portion of the material arrangement 400 that is associated with piers (e.g., structural piers, dielectric piers). Although the material arrangement 400 illustrates examples of certain relative dimensions and quantities of various features, aspects of the material arrangement 400 may be implemented with other relative dimensions or quantities of such features in accordance with examples as disclosed herein.

Operations illustrated in and described with reference to FIGS. 4 through 13 may be performed by a manufacturing system, such as a semiconductor fabrication system configured to perform additive operations such as deposition or bonding, subtractive operations such as etching, trenching, planarizing, or polishing, and supporting operations such as masking, patterning, photolithography, or aligning, among other operations that support the described techniques. In some examples, operations performed by such a manufacturing system may be supported by a process controller or its components as described herein.

Figure 4:
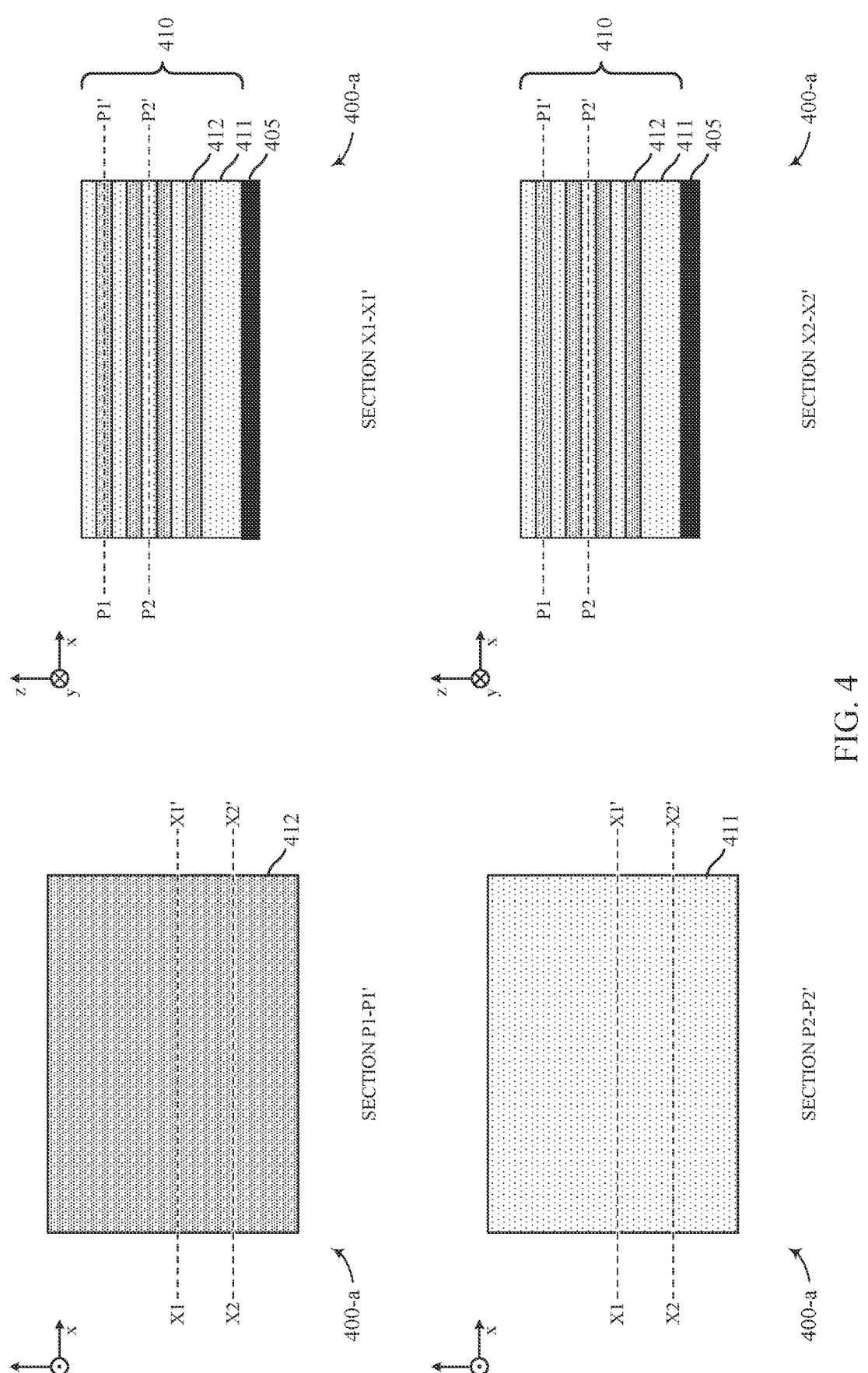
FIGS. 4 through 13 illustrate examples of operations that support trench and pier architectures for three-dimensional memory arrays in accordance with examples as disclosed herein.

FIG. 4 illustrates the material arrangement 400 (e.g., as a material arrangement 400-*a*) after a first set of one or more manufacturing operations. The first set of operations may include depositing a stack of layers 410 over a substrate 405. The substrate 405 may be a semiconductor wafer or other substrate over which the stack of layers 410 is deposited. Although the stack of layers 410 is illustrated as being deposited in direct contact with the substrate 405, in some other examples, the material arrangement 400 may include other materials or components between the stack of layers 410 and the substrate 405, such as interconnection or routing circuitry (e.g., access lines, sense lines 215, gate lines 210), control circuitry (e.g., transistors 225, aspects of a local memory controller 150, decoders, multiplexers), or another stack of layers 410 (e.g., another stack of layers 410 has been processed in accordance with examples as disclosed herein), which may include various conductor, semiconductor, or dielectric materials between the stack of layers 410 and the substrate 405. For example, the material arrangement 400 may include a layer including thin-film-transistors (TFT) between the substrate 405 and the stack of layers 410, such as transistors 225, among others. In some examples, the substrate 405 itself may include such interconnection or routing circuitry.

The stack of layers 410 may include alternating layers of a material 411 (e.g., a first material) and a material 412 (e.g., a second material), which may be formed at least in part using alternating material deposition operations. In some examples, the material 411 may include a dielectric material (e.g., a first dielectric material), such as an oxide (e.g., a tier oxide, an oxide of silicon), and may provide electrical isolation between levels 230. The material 412 may include various materials that are different than the material 411, which may support differential processing (e.g., differential etching, high selectivity). For example, the layers of the material 412 may be sacrificial layers (e.g., a material that may not be present in a completed portion of the material arrangement 400). In some examples, the material 412 may be a dielectric material, such as a nitride (e.g., a tier nitride, a nitride of silicon). Although the stack of layers 410 is illustrated with nine layers (e.g., five layers of the material 411 and four layers of the material 412), a stack of layers 410 in accordance with examples as disclosed herein may include any quantity of layers of each of two or more materials (e.g., tens of layers, hundreds of layers, and so on), with either the material 411 or the material 412 being relatively closest to the substrate 405.

Figure 5:
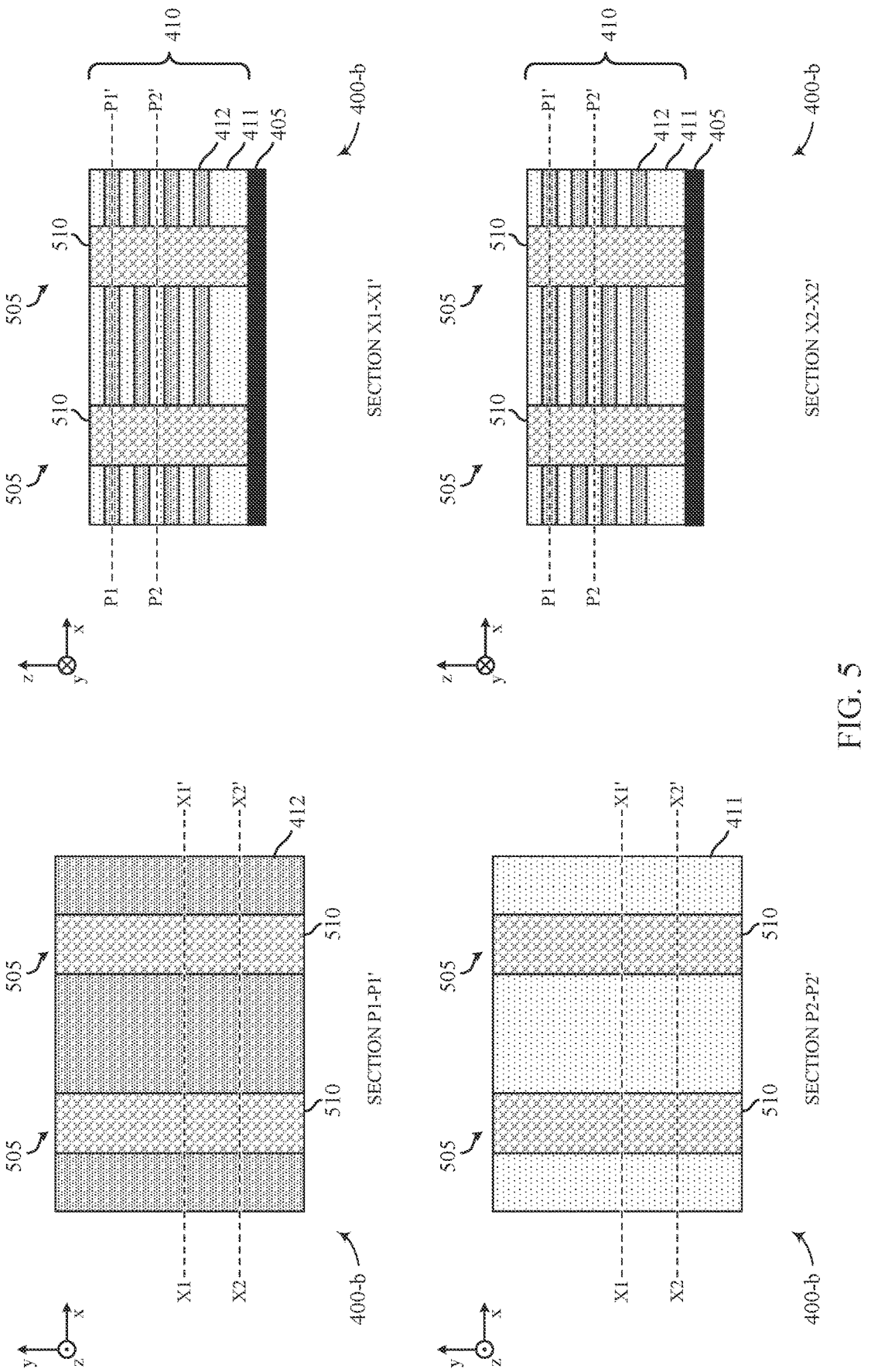

FIG. 5 illustrates the material arrangement 400 (e.g., as a material arrangement 400-b) after a second set of one or more manufacturing operations. The second set of operations may include operations (e.g., a trench etch operation) that support forming trenches 505 through the stack of layers 410 (e.g., by removing portions of the material 411 and the material 412 along the z-direction, to the substrate 405 or to an intervening material between the stack of layers 410 and the substrate 405). In some examples, forming the trenches 505 may involve depositing and patterning a masking material (e.g., above the stack of layers 410, not shown), which may be followed by an etching operation (e.g., a dry etching operation, such as reactive ion etching (RIE), that supports material removal that is preferentially directional along the z-direction). The trenches 505 may extend along the y-direction, and may correspond to an isolation region of a memory array that is located between access lines (e.g., between word lines 205, or projections thereof, along the y-direction). In some examples, the trenches 505 may be aligned along a direction of pillars 220. For example, sidewalls of the trenches 505 may coincide with sidewalls of pillars 220 that are formed in later operations, such that sidewalls of the trenches 505 may provide an alignment between pillars 220, among other features of material arrangement 400, to support operation as a memory array (e.g., to improve array density, to reduce a likelihood of misaligned features).

The second set of operations may also include operations (e.g., a trench fill operation) that support depositing a material 510 (e.g., one or more third materials) in the trenches 505. In some examples, the material 510 may be the same as the material 412 (e.g., a sacrificial material, a nitride material). In some other examples, the material 510 may be different than the material 411 and the material 412, which may support aspects of material removal differentiation (e.g., selectivity) among the material 411, the material 412, and the material 510. In some examples, the second set of operations may include planarization operation (e.g., a polishing operation, a chemical-mechanical planarization (CMP) operation) to flatten a top surface of the material arrangement 400-b, which may support aspects of subsequent operations.

Figure 6:
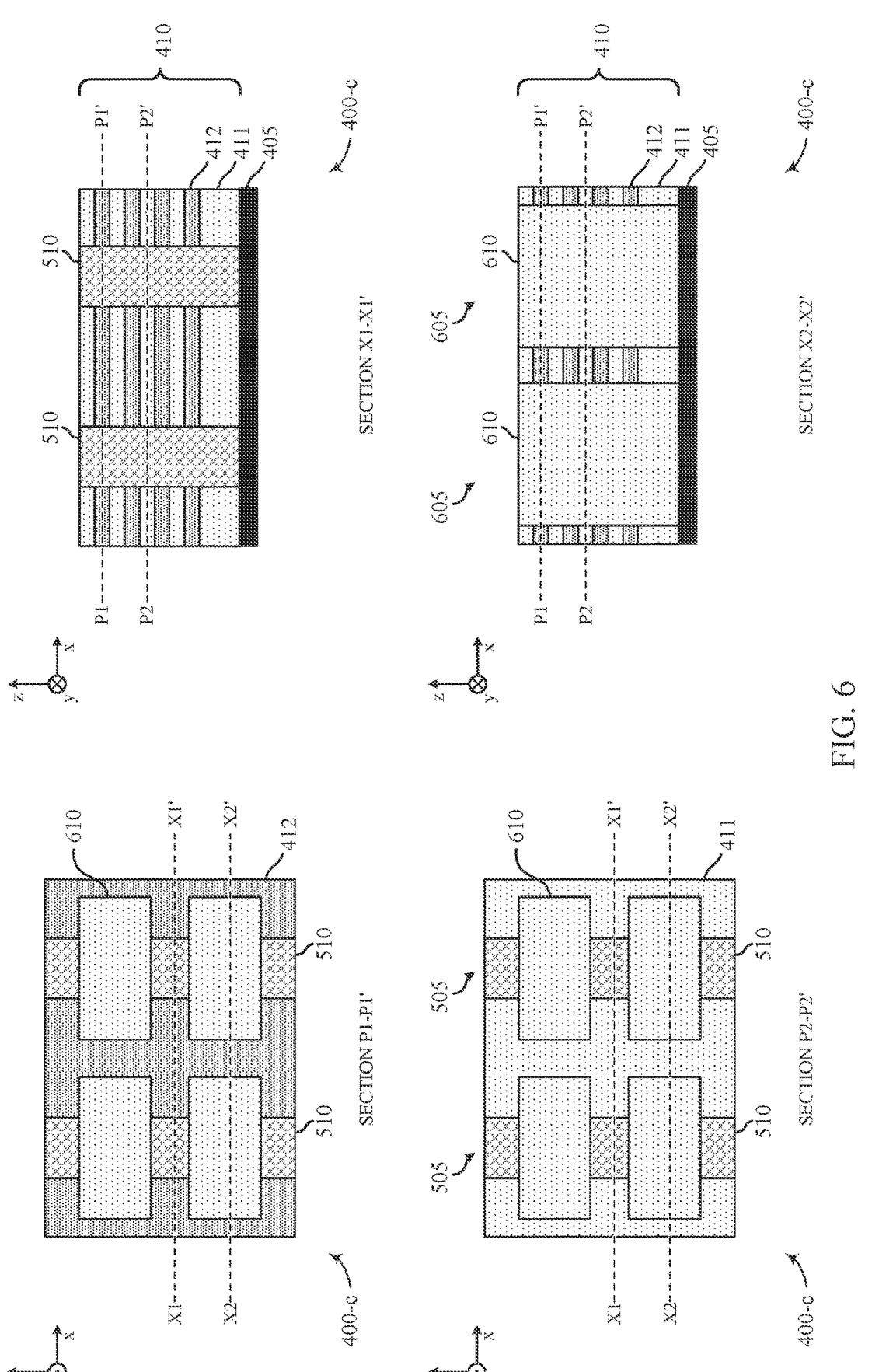

FIG. 6 illustrates the material arrangement 400 (e.g., as a material arrangement 400-c) after a third set of one or more manufacturing operations. The third set of operations may include operations (e.g., a pier etch operation) that support forming cavities 605 (e.g., first cavities) based at least in part on removing portions of the material 510 (e.g., first portions of the material 510, along the z-direction, to the substrate 405 or to an intervening material between the stack of layers 410 and the substrate 405). In some examples, forming each cavity 605 may expose a respective first sidewall of the stack of layers 410 on a first side of the cavity 605 (e.g., along the x-direction) and a respective second sidewall of the stack of layers 410 on a second side of the cavity 605 (e.g., along the x-direction). In some examples, forming the cavities 605 may also include removing portions of the material 411 and the material 412 (e.g., along the z-direction, to the substrate 405 or to an intervening material between the stack of layers 410 and the substrate 405), such as when the cavities 605 are formed to be wider, along the x-direction, than the trenches 505. In various examples, cavities 605 may be wider than trenches 505 to support a degree of misalignment between patterning for the cavities 605 and the trenches 505 (e.g., along the x-direction), or to support forming projections of the material 411 and the material 412 between the cavities 605 (e.g., along the x-direction, for formation of memory cells 105), or both, among other reasons. In some examples, forming the cavities 605 may involve depositing and patterning a masking material (e.g., above the stack of layers 410 and material 510, not shown), which may be followed by an etching operation (e.g., a dry etching operation, such as reactive ion etching (RIE), that supports material removal that is preferentially directional along the z-direction).

The third set of operations may also include operations (e.g., a pier fill operation) that support forming (e.g., along each trench 505, in sets along the z-direction) a plurality of piers (e.g., dielectric piers). For example, the third set of operations may include depositing a material 610 (e.g., one or more fourth materials) in the cavities 605 (e.g., in contact with exposed sidewalls of the stack of layers 410, in contact with the substrate 405). In some examples, the material 610 may be the same as the material 411 (e.g., a dielectric material, an oxide material). In some examples, the material 610 of the piers may be chosen for having relatively high strength, high stiffness, bonding strength with the material 411, bonding strength with the substrate 405, or any combination thereof. In some examples, the material 610 of the piers may be chosen for having a high selectivity for differential processing relative to the material 412, such as examples where the material 412 is removed in subsequent operations. In some examples, the piers may be formed from multiple materials deposited in the cavities 605, such as when a pier is formed by first depositing a liner material (e.g., a dielectric liner) in the cavities 605, followed by filling the liner material (e.g., with a material that may be a conductor, a semiconductor, or a dielectric). In some examples, the third set of operations may include planarization operation (e.g., a polishing operation, a chemical-mechanical planarization (CMP) operation) to flatten a top surface of the material arrangement 400-*c*, which may support aspects of subsequent operations.

Figure 7:
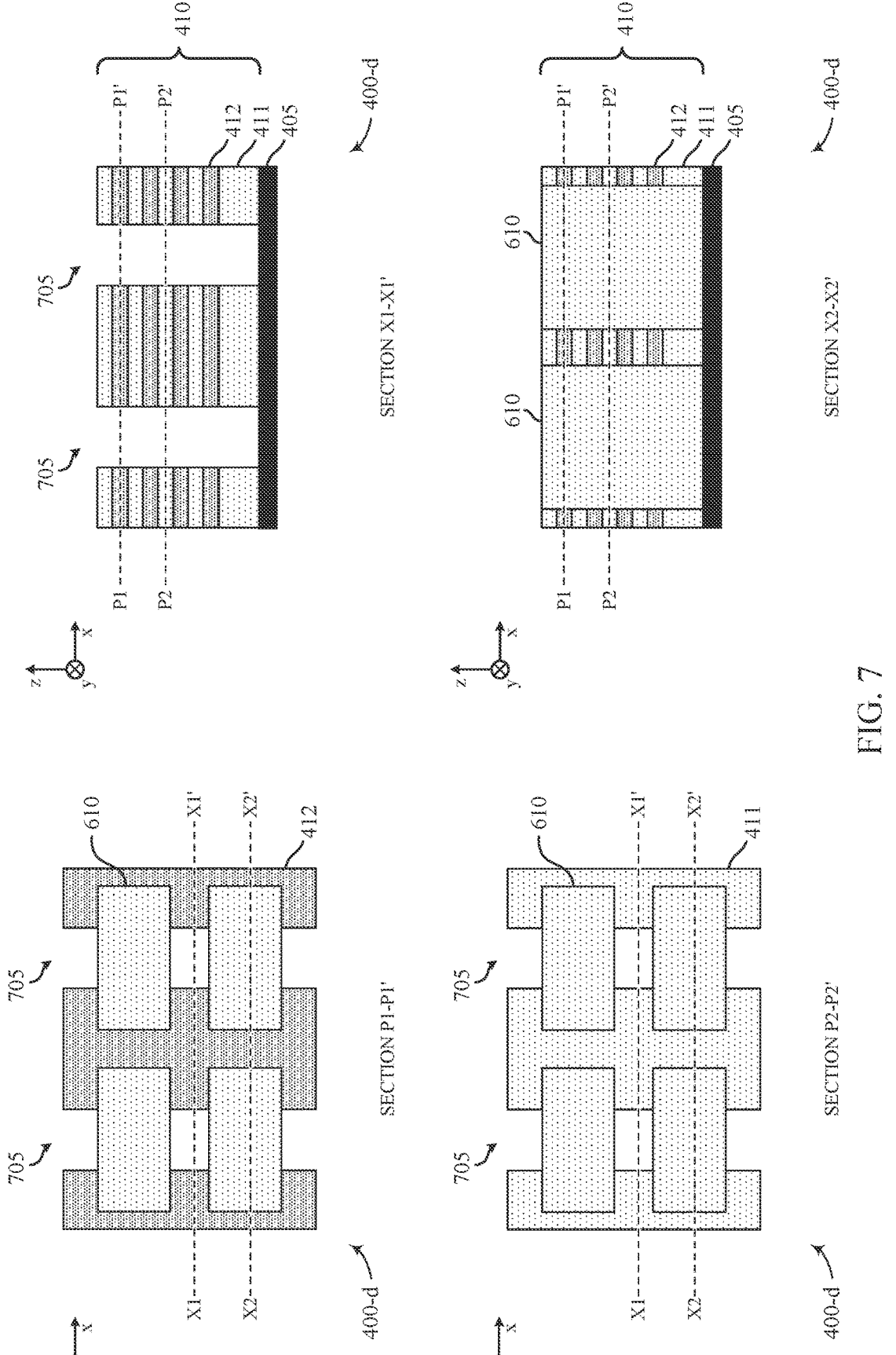

FIG. 7 illustrates the material arrangement 400 (e.g., as a material arrangement 400-*d*) after a fourth set of one or more manufacturing operations. The fourth set of operations may include operations (e.g., a pillar etch operation) that support forming cavities 705 (e.g., second cavities) based at least in part on removing portions of the material 510 (e.g., second portions of the material 510, along the z-direction, to the substrate 405 or to an intervening material between the stack of layers 410 and the substrate 405). In some examples, forming each cavity 705 may expose a respective first sidewall of the stack of layers 410 on a first side of the cavity 705 (e.g., along the x-direction) and a respective second sidewall of the stack of layers 410 on a second side of the cavity 705 (e.g., along the x-direction). In some examples, forming each cavity 705 may expose a respective sidewall of a first pier (e.g., of material 610) on a first side of the cavity 705 (e.g., along the y-direction) and a respective sidewall of a second pier on a second side of the cavity 705 (e.g., along the y-direction). In some examples, forming the cavities 705 may involve depositing and patterning a masking material (e.g., above the stack of layers 410, the material 510, and the material 610, not shown), which may be followed by an etching operation (e.g., a dry etching operation, such as reactive ion etching (RIE), that supports material removal that is preferentially directional along the z-direction). In some other examples, forming the cavities 705 may omit patterning and may, alternatively, employ another material removal operation, such as a wet etch operation, that preferentially removes remaining portions of the material 510. In some examples, (e.g., when the material 510 is the same as the material 412), such an etching operation may also be associated with removing remaining portions of the material 412.

Figure 8:
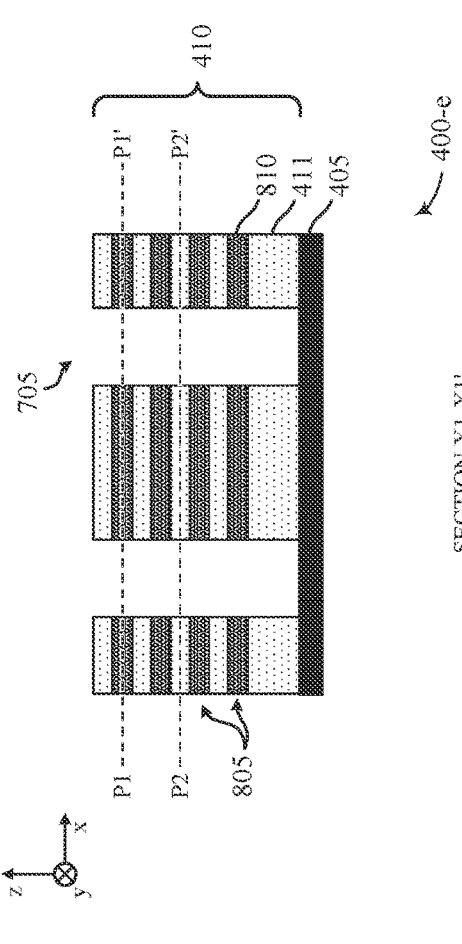
Figure 8:
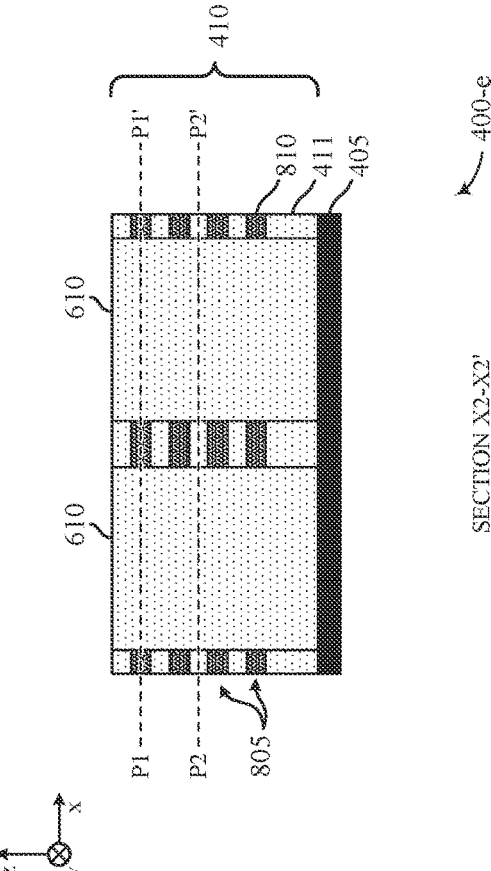
Figure 8:
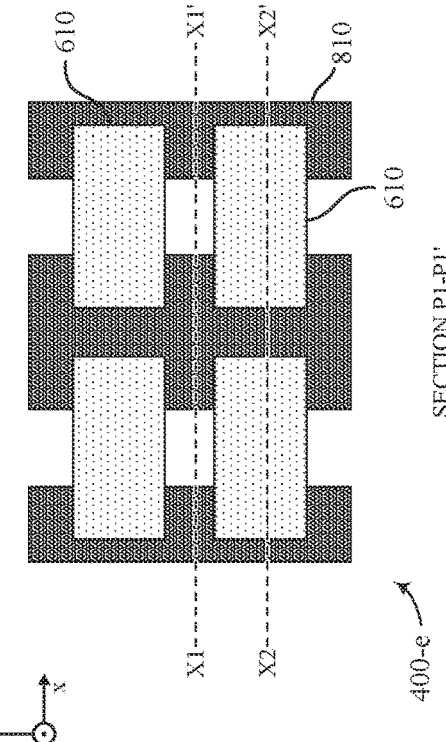
Figure 8:
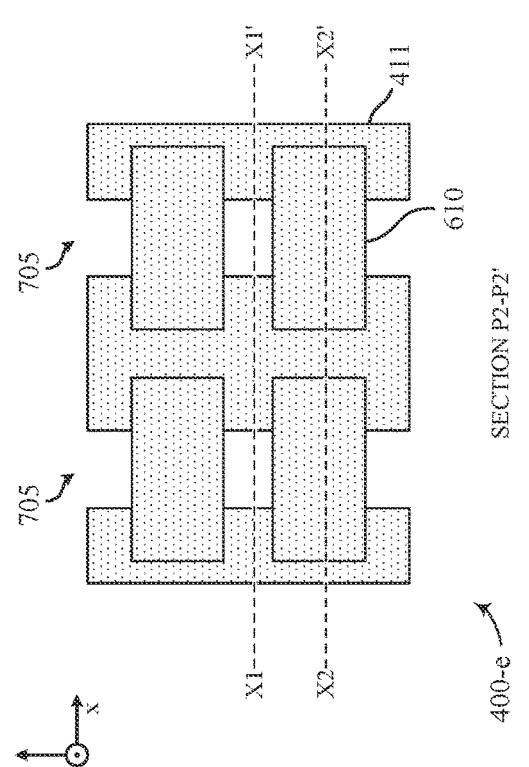

FIG. 8 illustrates the material arrangement 400 (e.g., as a material arrangement 400-*e*) after a fifth set of one or more manufacturing operations. The fifth set of operations may include operations that support forming access lines (e.g., word lines 205) in the material arrangement 400. For example, the fifth set of operations may include operations (e.g., exhumation operations, nitride exhumation) that support forming voids 805 between the material 411. For example, the fifth set of operations may include removing (e.g., etching, exhuming) the material 412, which may form voids 805 between the remaining layers of the material 411. The fifth set of operations also may expose sidewalls, or portions thereof, of the piers (e.g., of the material 610, sidewalls in an xz-plane, sidewall portions in a yz-plane between layers of the material 411).

As illustrated in FIG. 8, the piers of material 610 may remain in contact with the layers of the material 411 and the substrate 405, which may provide mechanical support to the remaining portions of the material 411 (e.g., reducing deflection of the remaining layers of the material 411 along the z-direction, reducing deflection of the remaining layers of the material 411 along the x-direction, reducing bending of the remaining layers of the material 411, reducing an unsupported length or cantilever of the remaining layers of the material 411). Thus, by implementing the piers of material 610, the cavities 705 and the voids 805 may be formed with improved stability or tolerances, such that formation of features within the cavities 705 and voids 805 (e.g., pillars 220, word lines 205, memory cells 105, between the remaining layers of the material 411 along the z-direction) may be performed with reduced variability or otherwise improved consistency.

The fifth set of operations may also include operations (e.g., one or more conductor deposition operations) that support forming the access lines based at least in part on depositing one or more materials 810 (e.g., conductive materials) in the voids 805. In some examples, the fifth set of operations may include depositing a first conductive material on exposed surfaces of the material arrangement 400, which may include depositing the first conductive material in contact with the layers of the material 411, in contact with the substrate 405, and in contact with exposed sidewalls, or portions thereof, of the piers of material 610. In some examples, the first conductive material may include a barrier material (e.g., a conductive barrier, a liner material, a ceramic material, an electrode material) such as titanium nitride, titanium silicon nitride, tungsten silicon nitride, or others. In some such examples, the fifth set of operations may also include depositing a second conductive material on exposed surfaces of the first conductive material, which may include depositing the second conductive material in contact with the first conductive material to fill remaining portions of the voids 805. In some examples, the second conductive material may include a metal material, such as tungsten, or a metal alloy. In some other examples, the fifth set of operations may include depositing a single conductive material (e.g., omitting a barrier material), such as when the single conductive material is compatible with adjacent materials (e.g., compatible with the substrate 405, compatible with the material 411, compatible with a material deposited in contact with the single conductive material in a later operation).

Figure 9:
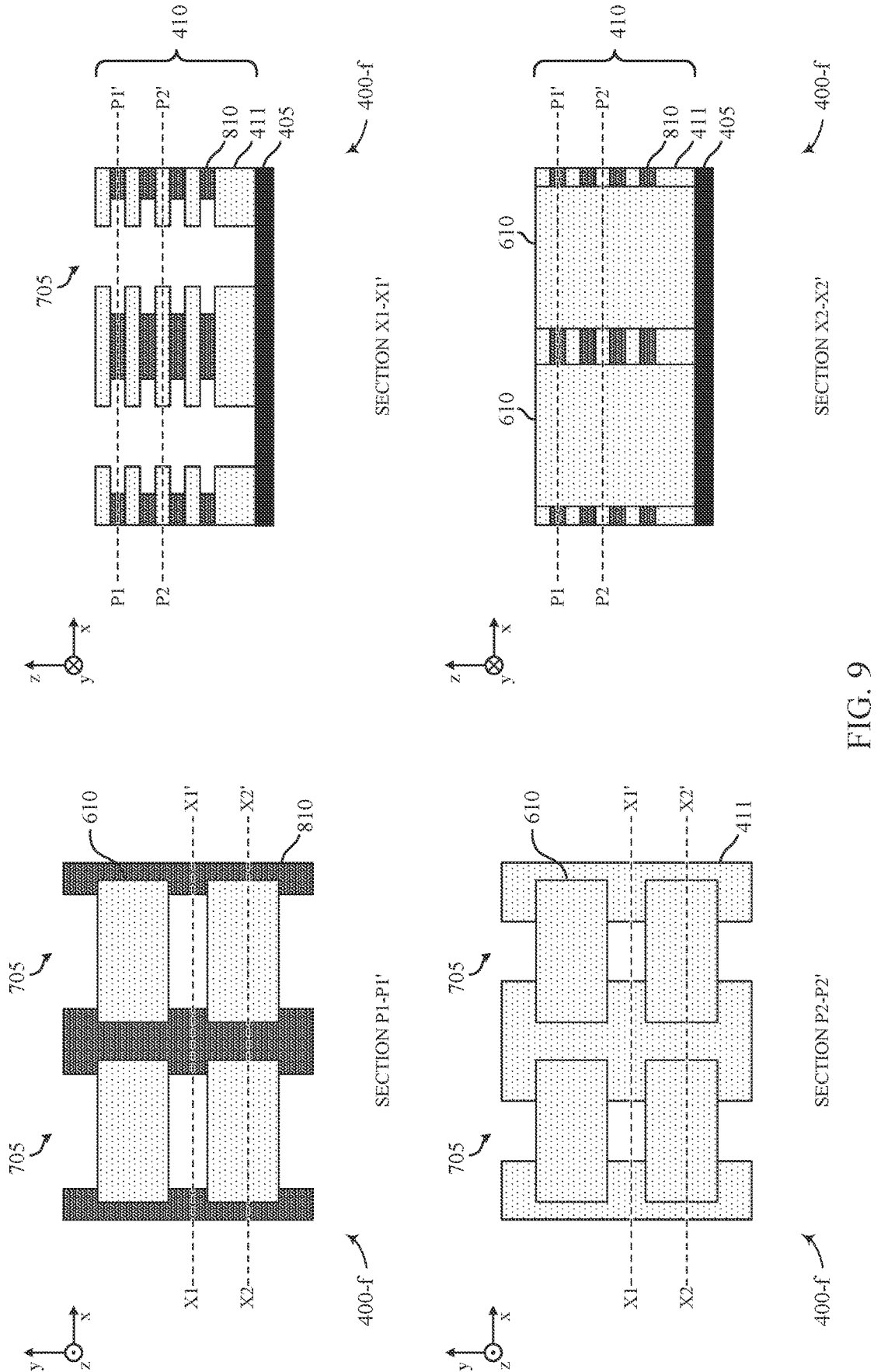

FIG. 9 illustrates the material arrangement 400 (e.g., as a material arrangement 400-*f*) after a sixth set of one or more manufacturing operations. The sixth set of operations may include further operations (e.g., a metal recess etch) that support forming the access lines between the layers of the material 411. For example, the sixth set of operations may include removing (e.g., etching) exposed portions of the one or more materials 810, which may recess portions of the materials 810 to be within the voids 805, and which may expose the substrate 405 and at least sidewalls of the material 411. Such operations may clear the materials 810 from the cavities 705.

Figure 10:
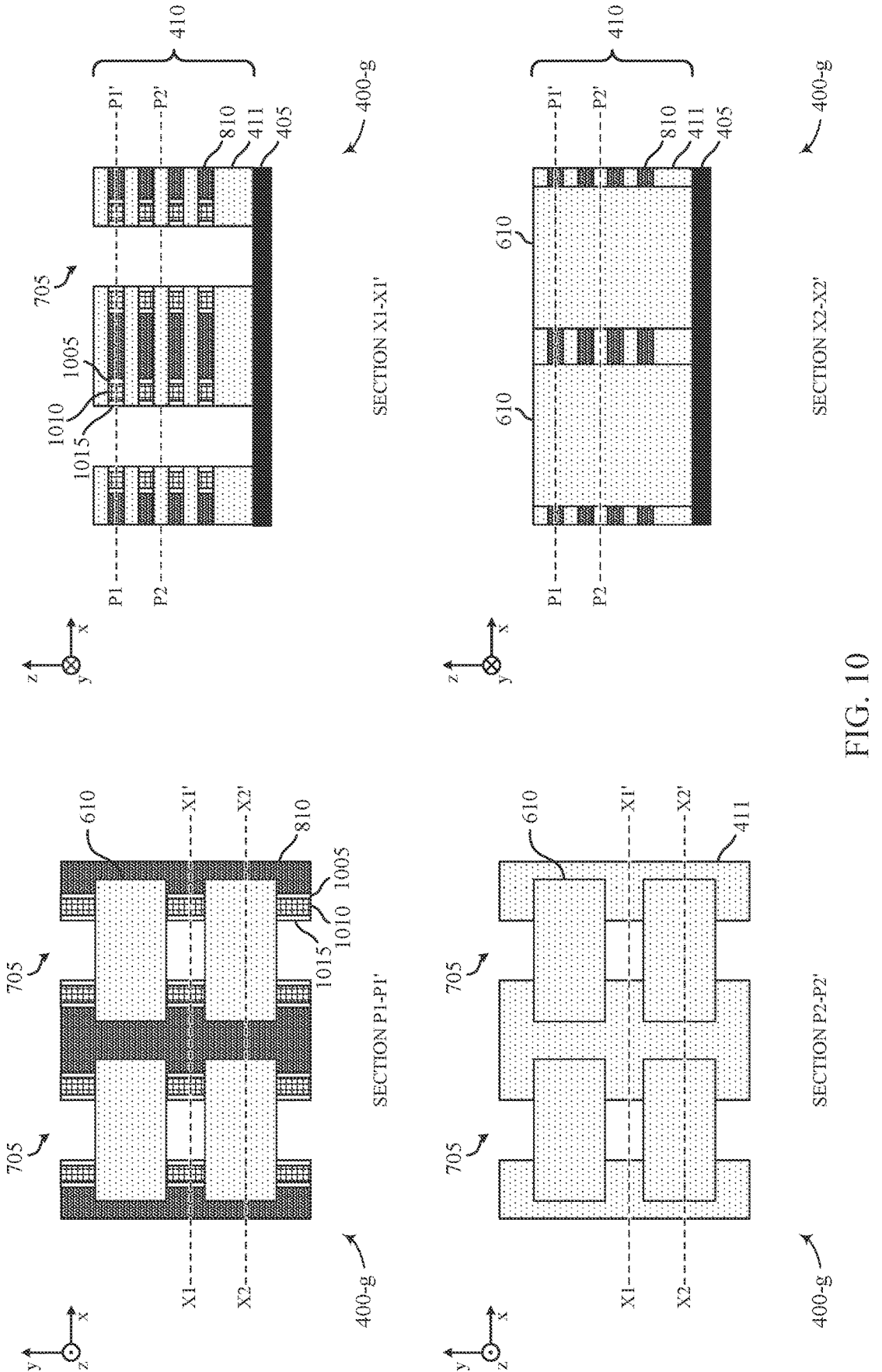

FIG. 10 illustrates the material arrangement 400 (e.g., as a material arrangement 400-*g*) after a seventh set of one or more manufacturing operations. The seventh set of operations may include operations that support forming memory cells, electrically coupled with the access lines (e.g., coupled with materials 810 along the x-direction), based on depositing a memory material (e.g., a chalcogenide) in the voids 805. In some examples, the seventh set of operations may include depositing a material 1005 (e.g., a first electrode material, a first liner material, a first conductive barrier material) in contact with exposed portions of the materials 810, which may involve a subsequent recess operation to recess the material 1005 to be within the voids 805. In some examples, the seventh set of operations may also include depositing a material 1010 (e.g., a memory material, a storage material, a chalcogenide) in contact with exposed portions of the material 1005, which also may involve a subsequent recess operation to recess the material 1010 to be within the voids 805. In some examples, the seventh set of operations may include depositing a material 1015 (e.g., a second electrode material, a second liner material, a second conductive barrier material) in contact with exposed portions of the material 1010, which also may involve a subsequent recess operation to recess the material 1005 to be within the voids 805. In some examples, depositing the material 1005 may be omitted (e.g., when the material 1010 is compatible with the one or more materials 810), or depositing the material 1015 may be omitted (e.g., when an electrode or barrier material is deposited in the cavities 705 after the seventh set of operations), or both depositing the material 1005 and depositing the material 1015 may be omitted.

Figure 11:
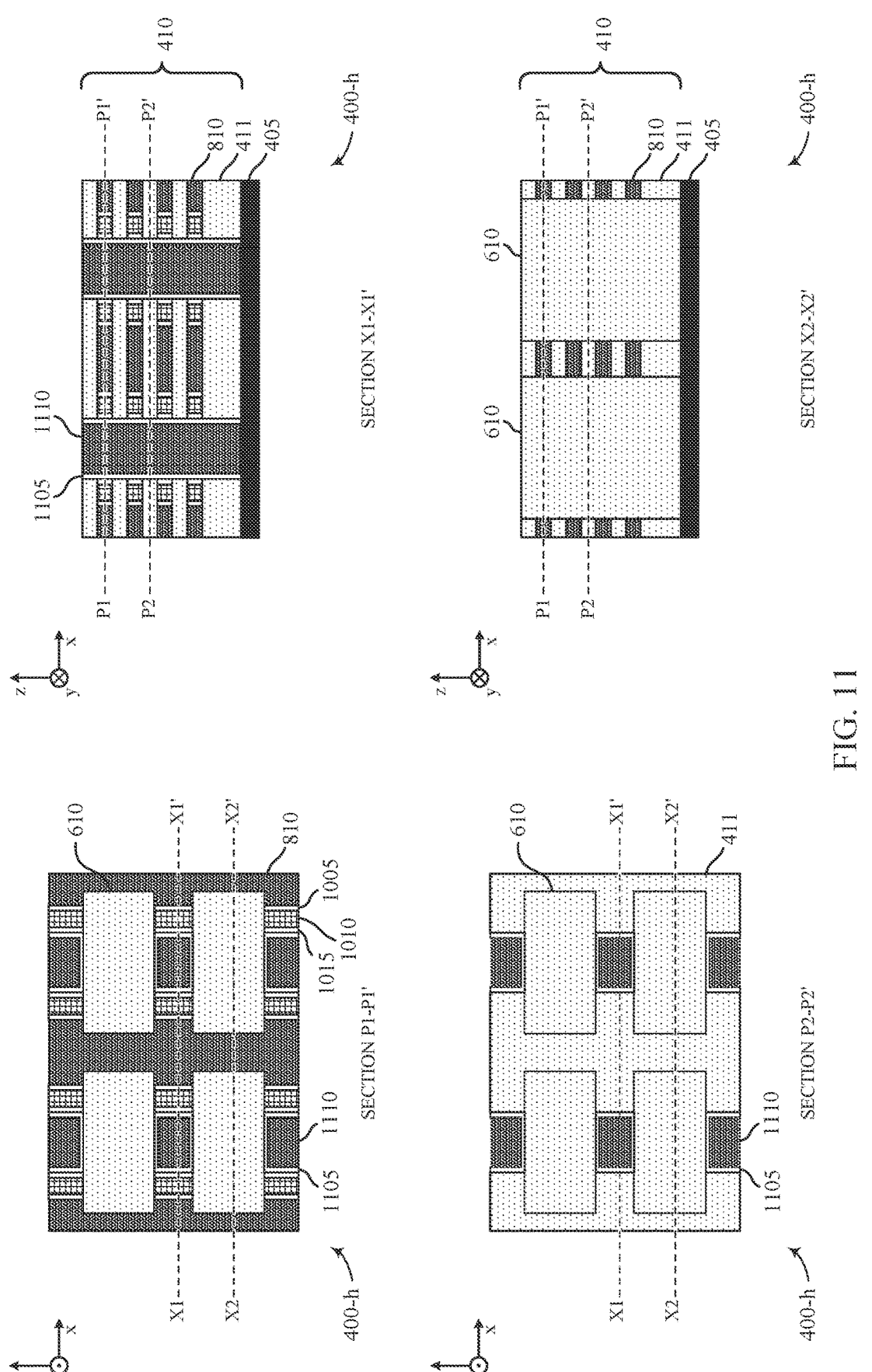

FIG. 11 illustrates the material arrangement 400 (e.g., as a material arrangement 400-*h*) after an eighth set of one or more manufacturing operations. The eighth set of operations may include operations that support forming conductive pillars in the cavities 705 (e.g., respective portions of the trenches 505). In some examples, the eighth set of operations may include depositing a material 1105 (e.g., a barrier material, an electrode material, a conductive material) on exposed surfaces of the cavities 705, which may include depositing the material 1105 in contact with the layers of the material 411, in contact with exposed surfaces of the material 1015 (where included), and in contact with the substrate 405. In various examples, the material 1105 may be a metal, a carbide, or a barrier material such as titanium nitride, titanium silicon nitride, tungsten silicon nitride, among other materials. In some examples, the eighth set of operations may include removing (e.g., etching) portions the material 1105 at the bottom of the cavities 705, which may expose the substrate 405 (e.g., exposing other circuitry, such as transistors 225). In some examples, such an operation on the material 1105 may be omitted.

In some examples, the eighth set of operations may also include depositing a material 1110 (e.g., a conductive material) on exposed surfaces of the material 1105 (e.g., and the substrate 405, when the material 1105 is removed from the substrate 405), which may include depositing the material 1110 in contact with the material 1105 (e.g., and the substrate 405) to fill remaining portions of the cavities 705. In some examples, the material 1110 may be the same as one or more of the materials 810 (e.g., a conductive material). For example, the material 1110 may include a metal material, such as tungsten, or a metal alloy. Accordingly, the material arrangement 400 may include pillars (e.g., pillars 220) formed at least in part from a material 1110 (e.g., and a material 1105, where included), and may, in various examples, be in contact with a material 1015. In some examples, the eighth set of operations may include depositing a single conductive material (e.g., omitting a barrier material or electrode material), such as when the single conductive material is compatible with adjacent materials (e.g., compatible with the substrate 405, compatible with the material 1015, compatible with a material deposited in contact with the single conductive material in a later operation).

Figure 12:
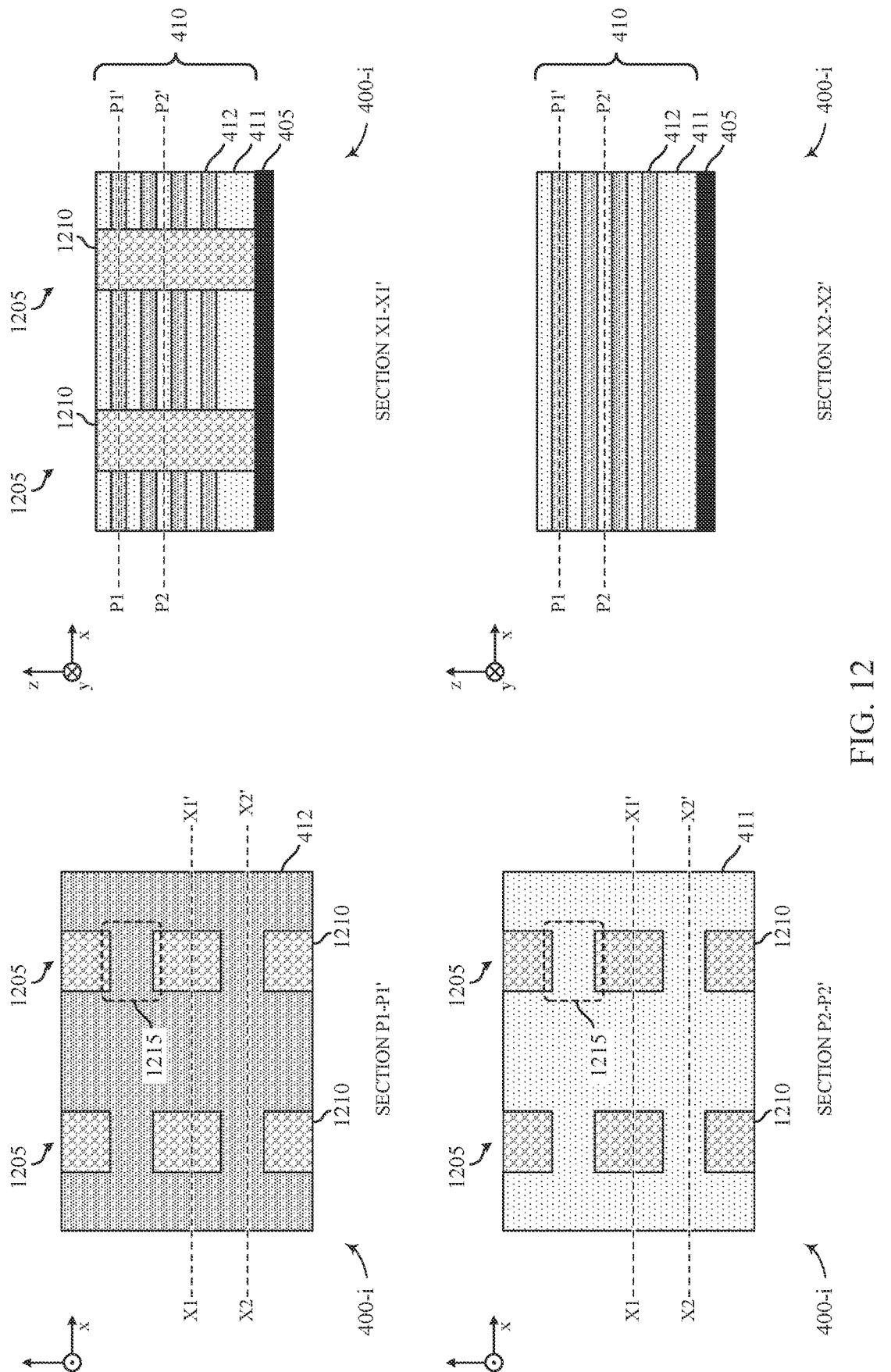
Figure 13:
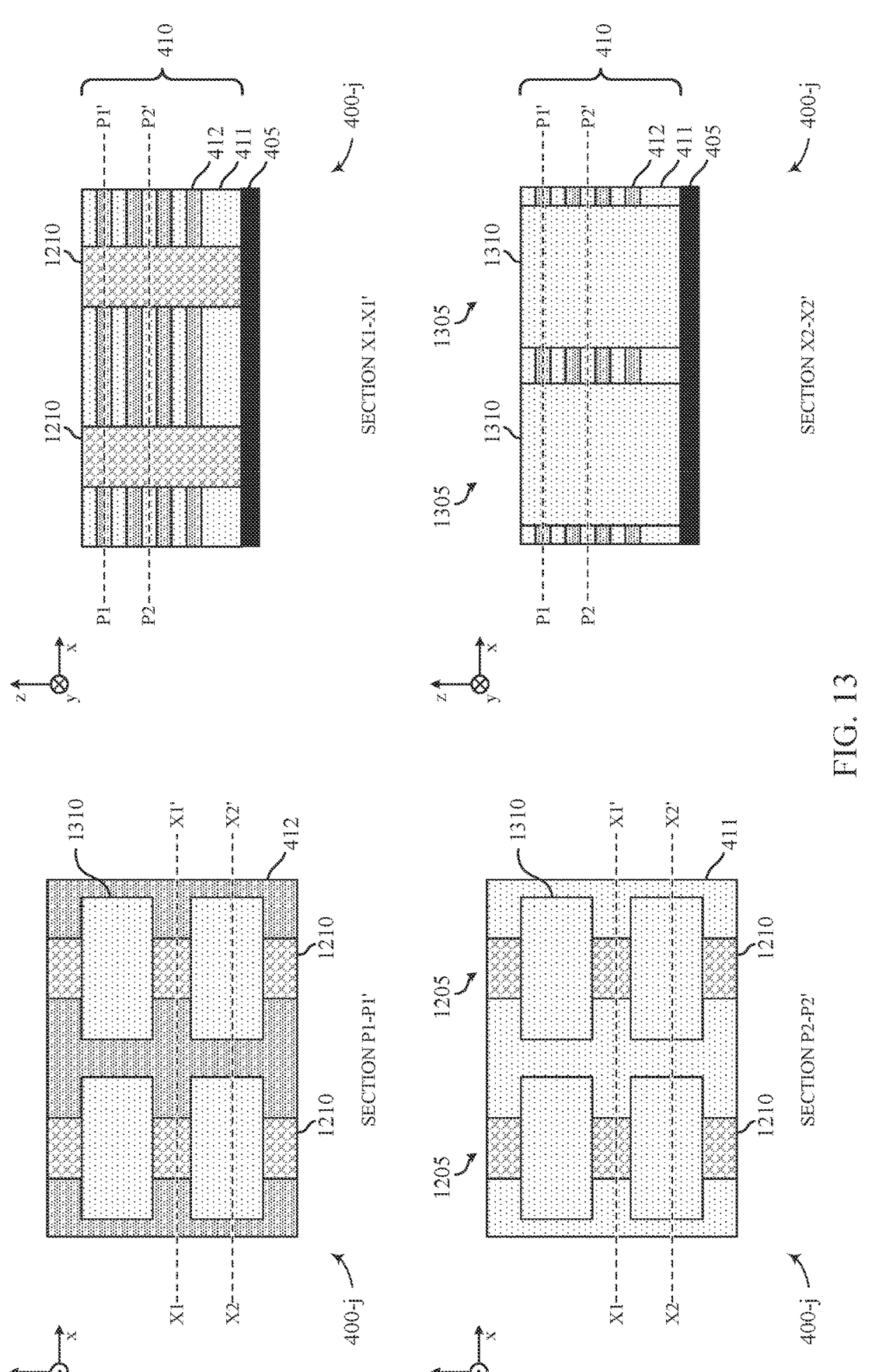

FIGS. 12 and 13 illustrate portions of the material arrangement 400 after alternative sets of operations, which may be implemented to improve aspects of structural stability for the formation of the material arrangement 400. For example, aspects of such alternative sets of operations may supplement or replace the formation of trenches 505 of the second set of operations described with reference to FIG. 5.

FIG. 12 illustrates the material arrangement 400 (e.g., as a material arrangement 400-*i*) after a first set of one or more alternative manufacturing operations. In some examples, the first set of alternative operations may be an alternative to aspects of the second set of operations described with reference to FIG. 5. The first set of alternative operations may include operations (e.g., a first cavity etch operation) that support forming cavities 1205 (e.g., first cavities) through the stack of layers 410 (e.g., by removing portions of the material 411 and the material 412 along the z-direction, to the substrate 405 or to an intervening material between the stack of layers 410 and the substrate 405). In some examples, forming the cavities 1205 may involve depositing and patterning a masking material (e.g., above the stack of layers 410, not shown), which may be followed by an etching operation (e.g., a dry etching operation, such as reactive ion etching (RIE), that supports material removal that is preferentially directional along the z-direction). The cavities 1205 may be arranged (e.g., aligned) along the y-direction, and may correspond to an isolation region of a memory array that is located between access lines (e.g., between word lines 205, or projections thereof, along the y-direction).

In some examples, the cavities 1205 may be aligned along a direction of pillars 220. For example, sidewalls of the cavities 1205 (e.g., extents along the x-direction, sidewalls in approximately a yz-plane) may coincide with sidewalls of pillars 220 that are formed in later operations, such that sidewalls of respective cavities 1205 may provide an alignment between pillars 220, among other features of material arrangement 400, to support operation as a memory array (e.g., to improve array density, to reduce a likelihood of misaligned features). Although such alignment may not be as positively located as when a trench 505 is formed (e.g., providing a common sidewall for forming multiple pillars 220), alignment of the cavities 1205 within a single patterning operation, or a single material removal operation, may provide sufficient alignment for later operations. However, by maintaining connecting portions 1215 (e.g., extending between portions of the stack of layers 410 along the x-direction), the remaining portions of the stack of layers 410 may be more favorably supported (e.g., to inhibit deflection along the x-direction, to inhibit bending about the y-direction, to inhibit bending about the z-direction, compared to the reduced support associated with forming trenches 505), which may support formation of subsequent features with reduced variability or otherwise improved consistency.

The first set of alternative operations may also include operations (e.g., a first cavity fill operation) that support depositing a material 1210 (e.g., one or more third materials) in the cavities 1205. In some examples, the material 1210 may be the same as the material 412 (e.g., a sacrificial material, a nitride material). In some other examples, the material 1210 may be different than the material 411 and the material 412, which may support aspects of material removal differentiation (e.g., selectivity) among the material 411, the material 412, and the material 1210. In some examples, the first set of alternative operations may include planarization operation (e.g., a polishing operation, a chemical-mechanical planarization (CMP) operation) to flatten a top surface of the material arrangement 400-*i*, which may support aspects of subsequent operations.

FIG. 13 illustrates the material arrangement 400 (e.g., as a material arrangement 400-*j*) after a second set of one or more alternative manufacturing operations. In some examples, the second set of alternative operations may be an alternative to aspects of the third set of operations described with reference to FIG. 6. The second set of alternative operations may include operations (e.g., a pier etch operation) that support forming cavities 1305 (e.g., second cavities) between portions of the material 1210 (along the z-direction, to the substrate 405 or to an intervening material between the stack of layers 410 and the substrate 405).

In some examples, forming each cavity 1305 may expose a respective first sidewall of the stack of layers 410 on a first side of the cavity 1305 (e.g., along the x-direction) and a respective second sidewall of the stack of layers 410 on a second side of the cavity 1305 (e.g., along the x-direction). In some examples, forming the cavities 1305 may also include removing portions of the material 411 and the material 412 (e.g., along the z-direction, to the substrate 405 or to an intervening material between the stack of layers 410 and the substrate 405), such as when the cavities 1305 are formed to be wider, along the x-direction, than the cavities 1205. In various examples, cavities 1305 may be wider than cavities 1205 to support a degree of misalignment between patterning for the cavities 1305 and the cavities 1205 (e.g., along the x-direction), or to support forming projections of the material 411 and the material 412 between the cavities 1305 (e.g., along the x-direction, for formation of memory cells 105), or both, among other reasons.

In some examples, forming each cavity 1305 may expose a respective sidewall of a first portion of the material 1210 on a first side of the cavity 1305 (e.g., along the y-direction) and a respective sidewall of a second portion of the material 1210 on a second side of the cavity 1305 (e.g., along the x-direction). In some examples, forming the cavities 1305 may also include removing portions of the material 1210 (e.g., along the z-direction, to the substrate 405 or to an intervening material between the stack of layers 410 and the substrate 405), such as when the cavities 1305 are formed to be wider, along the x-direction, than a spacing between cavities 1205 (e.g., where the cavities 1305 and the cavities 1205 are overlapping along the z-direction). In various examples, cavities 1305 may be wider than such spacing between cavities 1205 to support a degree of misalignment between patterning for the cavities 1305 and the cavities 1205 (e.g., along the y-direction), In some examples, forming the cavities 1305 may involve depositing and patterning a masking material (e.g., above the stack of layers 410 and material 1210, not shown), which may be followed by an etching operation (e.g., a dry etching operation, such as reactive ion etching (RIE), that supports material removal that is preferentially directional along the z-direction).

The second set of alternative operations may also include operations (e.g., a pier fill operation) that support forming a plurality of piers (e.g., dielectric piers). For example, the second set of alternative operations may include depositing a material 1310 (e.g., one or more fourth materials) in the cavities 1305 (e.g., in contact with exposed sidewalls of the stack of layers 410, in contact with the substrate 405, in contact with the material 1210). In some examples, the material 1310 may be the same as the material 411 (e.g., a dielectric material, an oxide material). In some examples, the material 1310 of the piers may be chosen for having relatively high strength, high stiffness, bonding strength with the material 411, bonding strength with the substrate 405, or any combination thereof. In some examples, the material 1310 of the piers may be chosen for having a high selectivity for differential processing relative to the material 412, such as examples where the material 412 is removed in subsequent operations. In some examples, the piers may be formed from multiple materials deposited in the cavities 1305, such as when a pier is formed by first depositing a liner material (e.g., a dielectric liner) in the cavities 1305, followed by filling the liner material (e.g., with a material that may be a conductor, a semiconductor, or a dielectric). In some examples, the third set of operations may include planarization operation (e.g., a polishing operation, a chemical-mechanical planarization (CMP) operation) to flatten a top surface of the material arrangement 400-*j*, which may support aspects of subsequent operations.

To complete aspects of the material arrangement 400, the manufacturing operations may proceed with performing, after the second set of alternative operations, the fourth through eighth sets of operations described with reference to FIGS. 7 through 11. Although the example of the first and second sets of alternative operations illustrate an example of connecting portions 1215 between each cavity 1205, various alternative arrangements may be implemented in accordance with the described techniques. For example, as a further alternative, trenches 505 may be replaced by trench segments that are separated (e.g., along the y-direction) by connecting portions similar to the connecting portions 1215, but separated by more than one pillar (e.g., where such connecting portions may be separated by more than one cavity 705). For example, such a further alternative may combine aspects of forming cavities 605 across a material 510 and forming cavities 1305 between portions of material 1210.

Accordingly, the described techniques for pier architectures may support various examples for forming an apparatus including aspects of a memory array 200. For example, such an apparatus may include a first set of dielectric portions (e.g., layers of material 411 distributed along the z direction, each extending along the y-direction and associated with a first position along the x-direction) and a second set of dielectric portions (e.g., layers of material 411 distributed along the z direction, each extending along the y-direction and associated with a second position along the x-direction). Such an apparatus also may include first access line portions (e.g., portions of access lines, such as portions of even word lines 205 extending along the y-direction, formed from materials 810) between first dielectric portions (e.g., along the z-direction), and second access line portions (e.g., portions of access lines, such as portions of odd word lines 205 extending along the y direction, formed from materials 810) between second dielectric portions (e.g., along the z-direction). Such an apparatus also may include piers (e.g., dielectric piers, piers of material 610, piers of material 1310) distributed along the y-direction and in contact with the first dielectric portions and the second dielectric portions, and pillars (e.g., pillars 220, pillars formed of material 1105 and material 1110, conductive pillars between the piers) distributed along the y-direction and between the first dielectric portions and second dielectric portions (e.g., along the x-direction). Such an apparatus also may include first memory cells (e.g., memory cells 105) between first dielectric portions (e.g., along the z-direction) and between the conductive pillars and the plurality of first access line portions (e.g., along the x-direction) and second memory cells between second dielectric portions (e.g., along the z-direction) and between the conductive pillars and the plurality of second access line portions (e.g., along the x-direction). In some examples, sidewalls of the conductive pillars may be aligned (e.g., along the x-direction) along a wall of a trench 505 or along walls of cavities 1205 and, in some examples, the piers may be wider (e.g., along the x-direction) than the pillars, or wider than a combined width of the conductive pillars and the first and second memory cells.

FIG. 14 shows a flowchart illustrating a method 1400 that supports trench and pier architectures for three-dimensional memory arrays in accordance with examples as disclosed herein. The operations of method 1400 may be implemented by a manufacturing system or associated components (e.g., one or more controllers) as described herein. For example, the operations of method 1400 may be performed by a manufacturing system as described with reference to FIGS. 4 through 11. In some examples, a manufacturing system may execute a set of instructions to control the functional elements of the device to perform the described functions. Additionally, or alternatively, the manufacturing system may perform aspects of the described functions using special-purpose hardware.

At 1405, the method may include depositing a stack of layers over a substrate, the stack of layers including alternating layers of a first dielectric material and a second material. The operations of 1405 may be performed in accordance with examples as disclosed herein.

At 1410, the method may include forming a plurality of trenches through the stack of layers, each trench of the plurality of trenches extending along a first direction. The operations of 1410 may be performed in accordance with examples as disclosed herein.

At 1415, the method may include forming, along each trench of the plurality of trenches, a plurality of dielectric piers based at least in part on depositing respective third dielectric material portions in the plurality of trenches. The operations of 1415 may be performed in accordance with examples as disclosed herein.

At 1420, the method may include forming a plurality of access lines based at least in part on depositing one or more first conductive materials in a plurality of voids between the layers of the first dielectric material. The operations of 1420 may be performed in accordance with examples as disclosed herein.

At 1425, the method may include forming a plurality of memory cells, electrically coupled with the plurality of access lines along a second direction, based at least in part on depositing a memory material in the plurality of voids. The operations of 1425 may be performed in accordance with examples as disclosed herein.

At 1430, the method may include forming, along each trench of the plurality of trenches, a plurality of conductive pillars, electrically coupled with the plurality of memory cells along the second direction, based at least in part on depositing one or more second conductive materials in the plurality of trenches. The operations of 1430 may be performed in accordance with examples as disclosed herein.

In some examples, an apparatus (e.g., a manufacturing system) as described herein may perform a method or methods, such as the method 1400. The apparatus may include features, circuitry, logic, means, or instructions (e.g., a non-transitory computer-readable medium storing instructions executable by one or more controllers to control one or more functional elements of the manufacturing system), or any combination thereof for performing the following aspects of the present disclosure:

Aspect 1: A method, apparatus, or non-transitory computer-readable medium including operations, features, circuitry, logic, means, or instructions, or any combination thereof for depositing a stack of layers over a substrate, the stack of layers including alternating layers of a first dielectric material and a second material; forming a plurality of trenches through the stack of layers, each trench of the plurality of trenches extending along a first direction; forming, along each trench of the plurality of trenches, a plurality of dielectric piers based at least in part on depositing respective third dielectric material portions in the plurality of trenches; forming a plurality of access lines based at least in part on depositing one or more first conductive materials in a plurality of voids between the layers of the first dielectric material; forming a plurality of memory cells, electrically coupled with the plurality of access lines along a second direction, based at least in part on depositing a memory material in the plurality of voids and; and forming, along each trench of the plurality of trenches, a plurality of conductive pillars, electrically coupled with the plurality of memory cells along the second direction, based at least in part on depositing one or more second conductive materials in the plurality of trenches.

Aspect 2: The method, apparatus, or non-transitory computer-readable medium of aspect 1, further including operations, features, circuitry, logic, means, or instructions, or any combination thereof for forming the plurality of voids between the layers of the first dielectric material based at least in part on removing the layers of the second material after forming the plurality of dielectric piers.

Aspect 3: The method, apparatus, or non-transitory computer-readable medium of any of aspects 1 through 2, further including operations, features, circuitry, logic, means, or instructions, or any combination thereof for depositing a fourth material in the plurality of trenches; forming a plurality of first cavities based at least in part on removing first portions of the fourth material; and forming the plurality of dielectric piers based at least in part on depositing the respective third dielectric material portions in a respective first cavity of the plurality of first cavities.

Aspect 4: The method, apparatus, or non-transitory computer-readable medium of aspect 3 where each first cavity of the plurality of first cavities is wider, along the second direction, than each trench of the plurality of trenches.

Aspect 5: The method, apparatus, or non-transitory computer-readable medium of any of aspects 3 through 4 where forming each first cavity of the plurality of first cavities exposes a respective first sidewall of the stack of layers on a first side of the first cavity along the second direction and a respective second sidewall of the stack of layers on a second side of the first cavity along the second direction and forming the plurality of dielectric piers includes depositing, in each first cavity, the respective third material portions in contact with the respective first sidewall and the respective second sidewall.

Aspect 6: The method, apparatus, or non-transitory computer-readable medium of any of aspects 3 through 5, further including operations, features, circuitry, logic, means, or instructions, or any combination thereof for forming a plurality of second cavities based at least in part on removing second portions of the fourth material adjacent to the plurality of dielectric piers and forming the plurality of conductive pillars based at least in part on depositing the one or more second conductive materials in the plurality of second cavities.

Aspect 7: The method, apparatus, or non-transitory computer-readable medium of aspect 6 where forming the plurality of second cavities is performed after forming the plurality of dielectric piers.

Aspect 8: The method, apparatus, or non-transitory computer-readable medium of any of aspects 3 through 7 where the fourth material is the same as the second material.

Aspect 9: The method, apparatus, or non-transitory computer-readable medium of any of aspects 3 through 8 where the fourth material is different than the first dielectric material and the second material.

Aspect 10: The method, apparatus, or non-transitory computer-readable medium of any of aspects 1 through 9, further including operations, features, circuitry, logic, means, or instructions, or any combination thereof for depositing, before depositing the memory material, a first conductive barrier material in contact with the plurality of access lines, where depositing the memory material includes depositing the memory material in contact with the first conductive barrier material and depositing, after depositing the memory material, a second conductive barrier material in contact with the memory material, where depositing the one or more second conductive materials includes depositing one of the one or more second conductive materials in contact with the second conductive barrier material.

Aspect 11: The method, apparatus, or non-transitory computer-readable medium of any of aspects 1 through 10 where the first dielectric material includes an oxide and the second material includes a nitride.

Aspect 12: The method, apparatus, or non-transitory computer-readable medium of any of aspects 1 through 11 where the third dielectric material is the same as the first dielectric material.

Aspect 13: The method, apparatus, or non-transitory computer-readable medium of any of aspects 1 through 12 where the memory material includes a chalcogenide.

Aspect 14: The method, apparatus, or non-transitory computer-readable medium of any of aspects 1 through 13 where the memory material is configured for storing a logic state based at least in part on a threshold voltage of the memory material.

Aspect 15: The method, apparatus, or non-transitory computer-readable medium of any of aspects 1 through 14 where the one or more first conductive materials, the one or more second conductive materials, or both include tungsten.

FIG. 15 shows a flowchart illustrating a method 1500 that supports trench and pier architectures for three-dimensional memory arrays in accordance with examples as disclosed herein. The operations of method 1500 may be implemented by a manufacturing system or associated components (e.g., one or more controllers) as described herein. For example, the operations of method 1500 may be performed by a manufacturing system as described with reference to FIGS. 7 through 13. In some examples, a manufacturing system may execute a set of instructions to control the functional elements of the device to perform the described functions. Additionally, or alternatively, the manufacturing system may perform aspects of the described functions using special-purpose hardware At 1505, the method may include depositing a stack of layers over a substrate, the stack of layers including alternating layers of a first dielectric material and a second material. The operations of 1505 may be performed in accordance with examples as disclosed herein.

At 1510, the method may include forming a plurality of first cavities, distributed along a first direction, through the stack of layers. The operations of 1510 may be performed in accordance with examples as disclosed herein.

At 1515, the method may include depositing a third material in the plurality of first cavities. The operations of 1515 may be performed in accordance with examples as disclosed herein.

At 1520, the method may include forming a plurality of second cavities, distributed along the first direction between portions of the third material, through the stack of layers. The operations of 1520 may be performed in accordance with examples as disclosed herein.

At 1525, the method may include forming a plurality of piers based at least in part on depositing a fourth dielectric material in the plurality of second cavities. The operations of 1525 may be performed in accordance with examples as disclosed herein.

At 1530, the method may include forming a plurality of access lines based at least in part on depositing one or more first conductive materials in a plurality of voids between the layers of the first dielectric material. The operations of 1530 may be performed in accordance with examples as disclosed herein.

At 1535, the method may include forming a plurality of memory cells, electrically coupled with the plurality of access lines along a second direction, based at least in part on depositing a memory material in the plurality of voids. The operations of 1535 may be performed in accordance with examples as disclosed herein.

At 1540, the method may include forming a plurality of conductive pillars, electrically coupled with the plurality of memory cells along the second direction, based at least in part on depositing one or more second conductive materials between the plurality of piers. The operations of 1540 may be performed in accordance with examples as disclosed herein.

In some examples, an apparatus (e.g., a manufacturing system) as described herein may perform a method or methods, such as the method 1500. The apparatus may include features, circuitry, logic, means, or instructions (e.g., a non-transitory computer-readable medium storing instructions executable by one or more controllers to control one or more functional elements of the manufacturing system), or any combination thereof for performing the following aspects of the present disclosure:

Aspect 16: A method, apparatus, or non-transitory computer-readable medium including operations, features, circuitry, logic, means, or instructions, or any combination thereof for depositing a stack of layers over a substrate, the stack of layers including alternating layers of a first dielectric material and a second material; forming a plurality of first cavities, distributed along a first direction, through the stack of layers; depositing a third material in the plurality of first cavities; forming a plurality of second cavities, distributed along the first direction between portions of the third material, through the stack of layers; forming a plurality of piers based at least in part on depositing a fourth dielectric material in the plurality of second cavities; forming a plurality of access lines based at least in part on depositing one or more first conductive materials in a plurality of voids between the layers of the first dielectric material; forming a plurality of memory cells, electrically coupled with the plurality of access lines along a second direction, based at least in part on depositing a memory material in the plurality of voids; and forming a plurality of conductive pillars, electrically coupled with the plurality of memory cells along the second direction, based at least in part on depositing one or more second conductive materials between the plurality of piers.

Aspect 17: The method, apparatus, or non-transitory computer-readable medium of aspect 16, further including operations, features, circuitry, logic, means, or instructions, or any combination thereof for forming the plurality of voids between the layers of the first material based at least in part on removing the layers of the second material after forming the plurality of dielectric piers.

Aspect 18: The method, apparatus, or non-transitory computer-readable medium of any of aspects 16 through 17 where the plurality of second cavities are wider, along the second direction, than the plurality of first cavities.

Aspect 19: The method, apparatus, or non-transitory computer-readable medium of any of aspects 16 through 18 where the plurality of second cavities are overlapping, along the first direction, with the plurality of first cavities.

Aspect 20: The method, apparatus, or non-transitory computer-readable medium of any of aspects 16 through 19, further including operations, features, circuitry, logic, means, or instructions, or any combination thereof for forming a plurality of third cavities based at least in part on removing remaining portions of the third material after forming the plurality of piers and forming the plurality of conductive pillars based at least in part on depositing the one or more second conductive materials in the plurality of third cavities.

Aspect 21: The method, apparatus, or non-transitory computer-readable medium of any of aspects 16 through 20, further including operations, features, circuitry, logic, means, or instructions, or any combination thereof for depositing, before depositing the memory material, a first conductive barrier material in contact with the plurality of access lines, where depositing the memory material includes depositing the memory material in contact with the first conductive barrier material and depositing, after depositing the memory material, a second conductive barrier material in contact with the memory material, where depositing the one or more second conductive materials includes depositing one of the one or more second conductive materials in contact with the second conductive barrier material.

Aspect 22: The method, apparatus, or non-transitory computer-readable medium of any of aspects 16 through 21 where the first dielectric material includes an oxide and the second material includes a nitride.

Aspect 23: The method, apparatus, or non-transitory computer-readable medium of any of aspects 16 through 22 where the fourth dielectric material is the same as the first dielectric material.

Aspect 24: The method, apparatus, or non-transitory computer-readable medium of any of aspects 16 through 23 where the memory material includes a chalcogenide.

Aspect 25: The method, apparatus, or non-transitory computer-readable medium of any of aspects 16 through 24 where the memory material is configured for storing a logic state based at least in part on a threshold voltage of the memory material.

It should be noted that the methods described herein describe possible implementations, and that the operations and the steps may be rearranged or otherwise modified and that other implementations are possible. Further, portions from two or more of the methods may be combined.

An apparatus is described. The following provides an overview of aspects of the apparatus as described herein:

Aspect 26: An apparatus formed by a process including: depositing a stack of layers over a substrate, the stack of layers including alternating layers of a first dielectric material and a second material; forming a plurality of trenches through the stack of layers, each trench of the plurality of trenches extending along a first direction; forming, along each trench of the plurality of trenches, a plurality of piers based at least in part on depositing respective third dielectric material portions in the plurality of trenches; forming a plurality of access lines based at least in part on depositing one or more first conductive materials in a plurality of voids between the layers of the first dielectric material, forming a plurality of memory cells, electrically coupled with the plurality of access lines along a second direction, based at least in part on depositing a memory material in the plurality of voids and; and forming, along each trench of the plurality of trenches, a plurality of conductive pillars, electrically coupled with the plurality of memory cells along the second direction, based at least in part on depositing one or more second conductive materials in the plurality of trenches.

Another apparatus is described. The following provides an overview of aspects of the apparatus as described herein:

Aspect 27: An apparatus formed by a process including: depositing a stack of layers over a substrate, the stack of layers including alternating layers of a first dielectric material and a second material; forming a plurality of first cavities, distributed along a first direction, through the stack of layers; depositing a third material in the plurality of first cavities; forming a plurality of second cavities, distributed along the first direction between portions of the third material, through the stack of layers; forming a plurality of piers based at least in part on depositing a fourth dielectric material in the plurality of second cavities; forming a plurality of access lines based at least in part on depositing one or more first conductive materials in a plurality of voids between the layers of the first dielectric material; forming a plurality of memory cells, electrically coupled with the plurality of access lines along a second direction, based at least in part on depositing a memory material in the plurality of voids and; and forming a plurality of conductive pillars, electrically coupled with the plurality of memory cells along the second direction, based at least in part on depositing one or more second conductive materials between the plurality of piers.

Another apparatus is described. The following provides an overview of aspects of the apparatus as described herein:

Aspect 28: An apparatus, including: a plurality of first dielectric portions distributed along a first direction relative to a substrate; a plurality of second dielectric portions distributed along the first direction; a plurality of first access line portions between first dielectric portions of the plurality of first dielectric portions along the first direction, each first access line portion extending along a second direction; a plurality of second access line portions between second dielectric portions of the plurality of second dielectric portions along the first direction, each second access line portion extending along the second direction; a plurality of dielectric piers distributed along the second direction and in contact with the plurality of first dielectric portions and the plurality of second dielectric portions; a plurality of conductive pillars distributed along the second direction between the plurality of first dielectric portions and the plurality of second dielectric portions; a plurality of first memory cells between first dielectric portions of the plurality of first dielectric portions along the first direction and between the plurality of conductive pillars and the plurality of first access line portions along a third direction; and a plurality of second memory cells between second dielectric portions of the plurality of second dielectric portions along the first direction and between the plurality of conductive pillars and the plurality of second access line portions along the third direction.

Aspect 29: The apparatus of aspect 28, where sidewalls of the plurality of conductive pillars are aligned in the third direction along a wall of a trench between the first dielectric portions and the second dielectric portions.

Aspect 30: The apparatus of any of aspects 28 through 29, where the plurality of dielectric piers are wider, along the third direction, than the plurality of conductive pillars.

Aspect 31: The apparatus of any of aspects 28 through 30, where the plurality of dielectric piers are wider, along the third direction, than a combined width of the plurality of conductive pillars, the plurality of first memory cells, and the plurality of second memory cells.

Aspect 32: The apparatus of any of aspects 28 through 31, where the plurality of first dielectric portions, the plurality of second dielectric portions, and the plurality of dielectric piers include a same dielectric material.

Aspect 33: The apparatus of any of aspects 28 through 32, where the plurality of first memory cells and the plurality of second memory cells each include a chalcogenide.

Aspect 34: The apparatus of any of aspects 28 through 33, where the plurality of first memory cells and the plurality of second memory cells are each configured for storing a logic state based at least in part on a threshold voltage of a respective memory material portion.

Aspect 35: The apparatus of any of aspects 28 through 34, further including: a plurality of first barrier material portions between the plurality of first memory cells and the plurality of first access line portions; a plurality of second barrier material portions between the plurality of first memory cells and the plurality of conductive pillars; a plurality of third barrier material portions between the plurality of second memory cells and the plurality of second access line portions; and a plurality of fourth barrier material portions between the plurality of second memory cells and the plurality of conductive pillars.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals are capable of being communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components, the controller affects a change that prevents signals from flowing between the components using a conductive path that previously permitted signals to flow.

The term "layer" or "level" used herein refers to a stratum or sheet of a geometrical structure (e.g., relative to a substrate). Each layer or level may have three dimensions (e.g., height, width, and depth) and may cover at least a portion of a surface. For example, a layer or level may be a three-dimensional structure where two dimensions are greater than a third, e.g., a thin-film. Layers or levels may include different elements, components, or materials. In some examples, one layer or level may be composed of two or more sublayers or sublevels.

As used herein, the term "electrode" may refer to an electrical conductor, and in some examples, may be employed as an electrical contact to a memory cell or other component of a memory array. An electrode may include a trace, wire, conductive line, conductive layer, or the like that provides a conductive path between elements or components of a memory array.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described herein can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and modules described in connection with the disclosure herein may be implemented or performed with a general-purpose processor, a digital signal processor (DSP), an application-specific integrated circuit (ASIC), a field-programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A method, comprising:
   depositing a stack of layers over a substrate, the stack of layers comprising alternating layers of a first dielectric material and a second material;
   forming a plurality of trenches through the stack of layers, each trench of the plurality of trenches extending along a first direction;
   forming, along each trench of the plurality of trenches, a plurality of dielectric piers based at least in part on depositing respective third dielectric material portions in the plurality of trenches and in contact with the alternating layers of the first dielectric material and the second material;
   forming, after forming the plurality of dielectric piers, a plurality of voids between the layers of the first dielectric material based at least in part on removing the layers of the second material;
   forming, after forming the plurality of voids between the layers of the first dielectric material, a plurality of access lines in the plurality of voids between the layers of the first dielectric material based at least in part on depositing one or more first conductive materials in the plurality of voids between the layers of the first dielectric material;
   forming, after forming the plurality of access lines in the plurality of voids between the layers of the first dielectric material, a plurality of memory cells, electrically coupled with the plurality of access lines along a second direction, based at least in part on depositing a memory material in the plurality of voids between the layers of the first dielectric material; and
   forming, along each trench of the plurality of trenches, a plurality of conductive pillars, electrically coupled with the plurality of memory cells along the second direction, based at least in part on depositing one or more second conductive materials in the plurality of trenches.

2. The method of claim 1, further comprising:
   depositing a fourth material in the plurality of trenches;

forming a plurality of first cavities based at least in part on removing first portions of the fourth material; and forming the plurality of dielectric piers based at least in part on depositing the respective third dielectric material portions in a respective first cavity of the plurality of first cavities.

3. The method of claim 2, wherein each first cavity of the plurality of first cavities is wider, along the second direction, than each trench of the plurality of trenches.

4. The method of claim 2, wherein:

forming each first cavity of the plurality of first cavities exposes a respective first sidewall of the stack of layers on a first side of the first cavity along the second direction and a respective second sidewall of the stack of layers on a second side of the first cavity along the second direction; and forming the plurality of dielectric piers comprises depositing, in each first cavity, the respective third material portions in contact with the respective first sidewall and the respective second sidewall.

5. The method of claim 2, further comprising:

forming a plurality of second cavities based at least in part on removing second portions of the fourth material adjacent to the plurality of dielectric piers; and forming the plurality of conductive pillars based at least in part on depositing the one or more second conductive materials in the plurality of second cavities.

6. The method of claim 5, wherein forming the plurality of second cavities is performed after forming the plurality of dielectric piers.

7. The method of claim 2, wherein the fourth material is the same as the second material.

8. The method of claim 2, wherein the fourth material is different than the first dielectric material and the second material.

9. The method of claim 1, further comprising:

depositing, before depositing the memory material, a first conductive barrier material in contact with the plurality of access lines, wherein depositing the memory material comprises depositing the memory material in contact with the first conductive barrier material; and depositing, after depositing the memory material, a second conductive barrier material in contact with the memory material, wherein depositing the one or more second conductive materials comprises depositing one of the one or more second conductive materials in contact with the second conductive barrier material.

10. The method of claim 1, wherein:

the first dielectric material comprises an oxide; and the second material comprises a nitride.

11. The method of claim 1, wherein the third dielectric material is the same as the first dielectric material.

12. The method of claim 1, wherein the memory material comprises a chalcogenide.

13. The method of claim 1, wherein the memory material is configured for storing a logic state based at least in part on a threshold voltage of the memory material.

14. The method of claim 1, wherein the one or more first conductive materials, the one or more second conductive materials, or both comprise tungsten.

15. A method, comprising:

depositing a stack of layers over a substrate, the stack of layers comprising alternating layers of a first dielectric material and a second material;

forming a plurality of first cavities, distributed along a first direction, through the stack of layers;

depositing a third material in the plurality of first cavities;

forming a plurality of second cavities, distributed along the first direction between portions of the third material, through the stack of layers;

forming a plurality of piers based at least in part on depositing a fourth dielectric material in the plurality of second cavities and in contact with the alternating layers of the first dielectric material and the second material;

forming, after forming the plurality of piers, a plurality of voids between the layers of the first material based at least in part on removing the layers of the second material;

forming, after forming the plurality of voids between the layers of the first dielectric material, a plurality of access lines in the plurality of voids between the layers of the first dielectric material based at least in part on depositing one or more first conductive materials in the plurality of voids between the layers of the first dielectric material;

forming, after forming the plurality of access lines in the plurality of voids between the layers of the first dielectric material, a plurality of memory cells, electrically coupled with the plurality of access lines along a second direction, based at least in part on depositing a memory material in the plurality of voids between the layers of the first dielectric material; and forming a plurality of conductive pillars, electrically coupled with the plurality of memory cells along the second direction, based at least in part on depositing one or more second conductive materials between the plurality of piers.

16. The method of claim 15, wherein the plurality of second cavities are wider, along the second direction, than the plurality of first cavities.

17. The method of claim 15, wherein the plurality of second cavities are overlapping, along the first direction, with the plurality of first cavities.

18. The method of claim 15, further comprising:

forming a plurality of third cavities based at least in part on removing remaining portions of the third material after forming the plurality of piers; and forming the plurality of conductive pillars based at least in part on depositing the one or more second conductive materials in the plurality of third cavities.

19. The method of claim 15, further comprising:

depositing, before depositing the memory material, a first conductive barrier material in contact with the plurality of access lines, wherein depositing the memory material comprises depositing the memory material in contact with the first conductive barrier material; and depositing, after depositing the memory material, a second conductive barrier material in contact with the memory material, wherein depositing the one or more second conductive materials comprises depositing one of the one or more second conductive materials in contact with the second conductive barrier material.

20. The method of claim 15, wherein:

the first dielectric material comprises an oxide; and the second material comprises a nitride.

21. The method of claim 15, wherein the fourth dielectric material is the same as the first dielectric material.

22. The method of claim 15, wherein the memory material comprises a chalcogenide.

23. The method of claim 15, wherein the memory material is configured for storing a logic state based at least in part on a threshold voltage of the memory material.

24. The method of claim 1, wherein forming the plurality of voids between the layers of the first dielectric material exposes sidewalls of the plurality of dielectric piers between the layers of the first dielectric material.

25. The method of claim 15, wherein forming the plurality of voids between the layers of the first dielectric material exposes sidewalls of the plurality of piers between the layers of the first dielectric material.

\*    \*    \*    \*    \*